United States Patent
Cheng et al.

(10) Patent No.: US 12,484,327 B2
(45) Date of Patent: Nov. 25, 2025

(54) PRE-CLEANING FOR A DEEP TRENCH ISOLATION STRUCTURE IN A PIXEL SENSOR

(71) Applicant: Taiwan Semiconductor Manufacturing Company, Ltd., Hsinchu (TW)

(72) Inventors: Yu-Hung Cheng, Tainan (TW); Yu-Siang Fang, Tainan (TW); Ching I Li, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 598 days.

(21) Appl. No.: 17/663,801

(22) Filed: May 17, 2022

(65) Prior Publication Data

US 2023/0378215 A1 Nov. 23, 2023

(51) Int. Cl.
*H10F 39/00* (2025.01)
*H01L 21/306* (2006.01)

(52) U.S. Cl.
CPC ..... *H10F 39/807* (2025.01); *H01L 21/30604* (2013.01); *H10F 39/014* (2025.01)

(58) Field of Classification Search
CPC ....... C23C 14/021; C23C 14/06; C23C 14/14; C23C 14/16; H01L 21/02068; H01L 21/02041; H01L 21/02057; H01L 21/02301; H01L 27/1463; H01L 21/02532; H01L 21/76224–76237; H10F 39/8057; H10F 39/807
See application file for complete search history.

(56) References Cited

U.S. PATENT DOCUMENTS

| | | | | |
|---|---|---|---|---|
| 5,403,434 A | * | 4/1995 | Moslehi | H01L 21/02063 134/1 |
| 5,644,166 A | * | 7/1997 | Honeycutt | H01L 23/485 257/770 |
| 2019/0067006 A1 | * | 2/2019 | Hawrylchak | H01L 21/67109 |
| 2020/0043927 A1 | * | 2/2020 | Wang | H10D 84/859 |

(Continued)

OTHER PUBLICATIONS

Vladimir Machkaoutsan, et al.; "High Efficiency Low Temperature Pre-epi Clean Method for Advanced Group IV epi Processing"; 2013; ECS Transactions; vol. 50 (9); The Electrochemical Society; pp. 339-348.

*Primary Examiner* — Chad M Dicke
*Assistant Examiner* — Jeremy Daniel Watts
(74) *Attorney, Agent, or Firm* — Harrity & Harrity, LLP

(57) ABSTRACT

A cyclic pre-cleaning technique may be used to clean the surfaces of a recess in which a deep trench isolation (DTI) structure is to be formed. The cyclic pre-cleaning technique may include performing one or more deposition and etch cycles to remove oxygen from the surfaces of the recess to reduce the oxygen concentration in the surfaces of the recess. A passivation layer may be formed in the recess after the cyclic pre-cleaning technique is used to clean the surfaces. The cyclic pre-cleaning technique may include the use of germanium (Ge) to bond with oxygen in the surfaces of the recess, which results in the formation of germanium oxide (GeO). The germanium oxide is removed, resulting in reduced oxygen concentration in the surfaces of the recess. The reduced oxygen concentration increases the quality of epitaxial growth of the passivation layer in the recess.

20 Claims, 33 Drawing Sheets

(56) References Cited

U.S. PATENT DOCUMENTS

| | | | |
|---|---|---|---|
| 2021/0193704 A1* | 6/2021 | Sun | H10F 39/8037 |
| 2022/0189824 A1* | 6/2022 | Wang | H01L 21/02112 |
| 2023/0197525 A1* | 6/2023 | Briggs | H10D 84/0188 |
| | | | 438/154 |
| 2023/0386925 A1* | 11/2023 | Lee | H10D 30/62 |

* cited by examiner

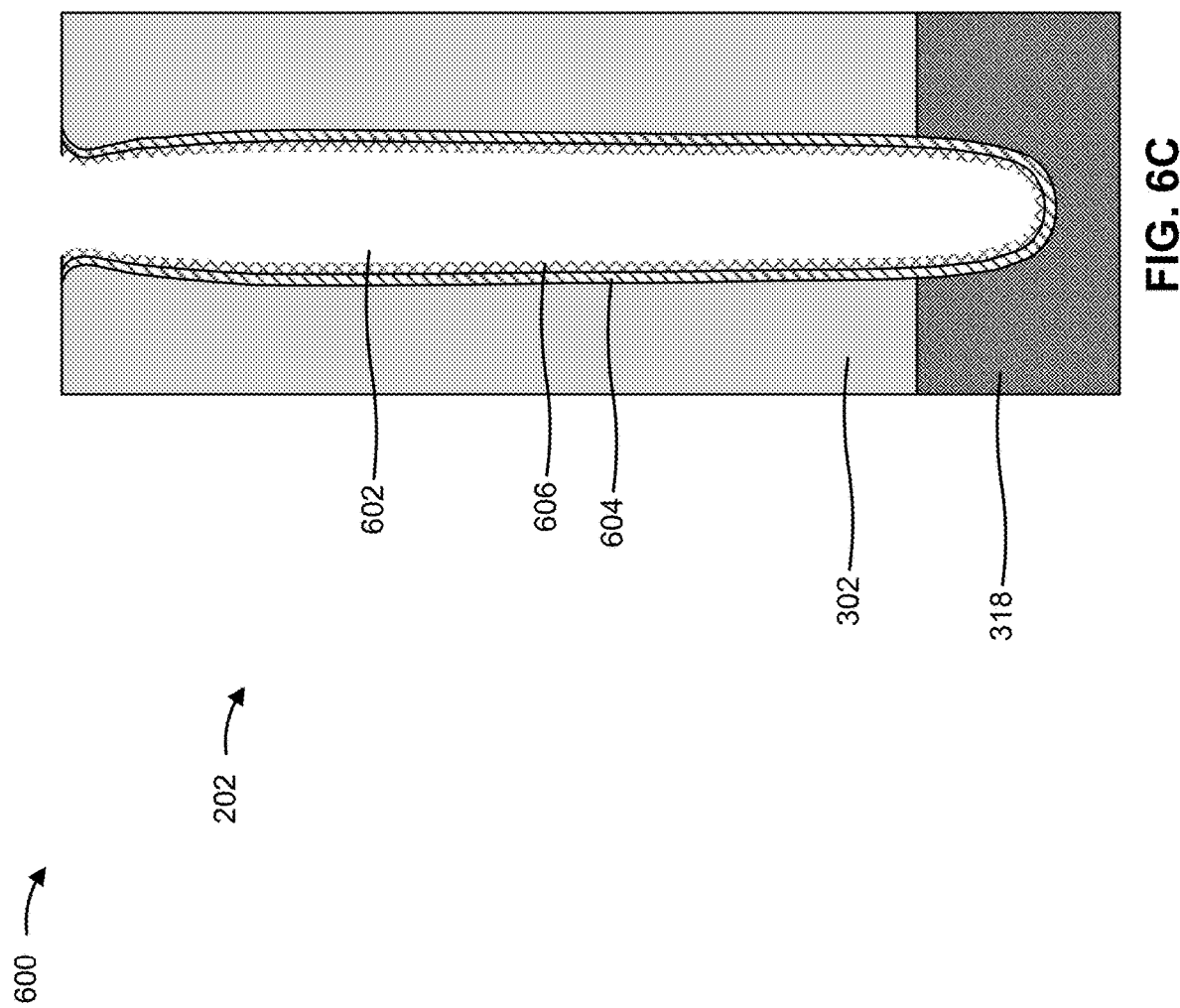

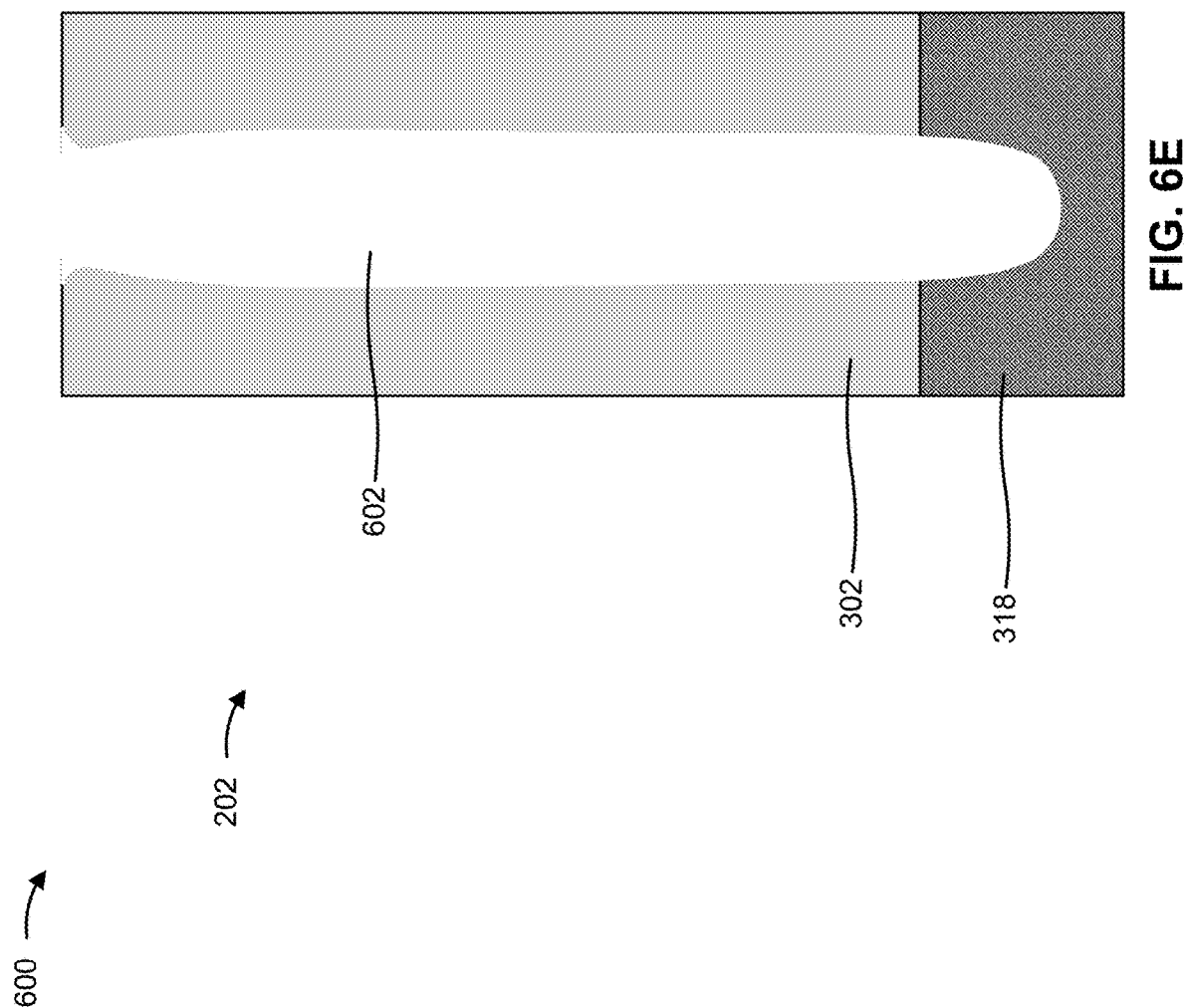

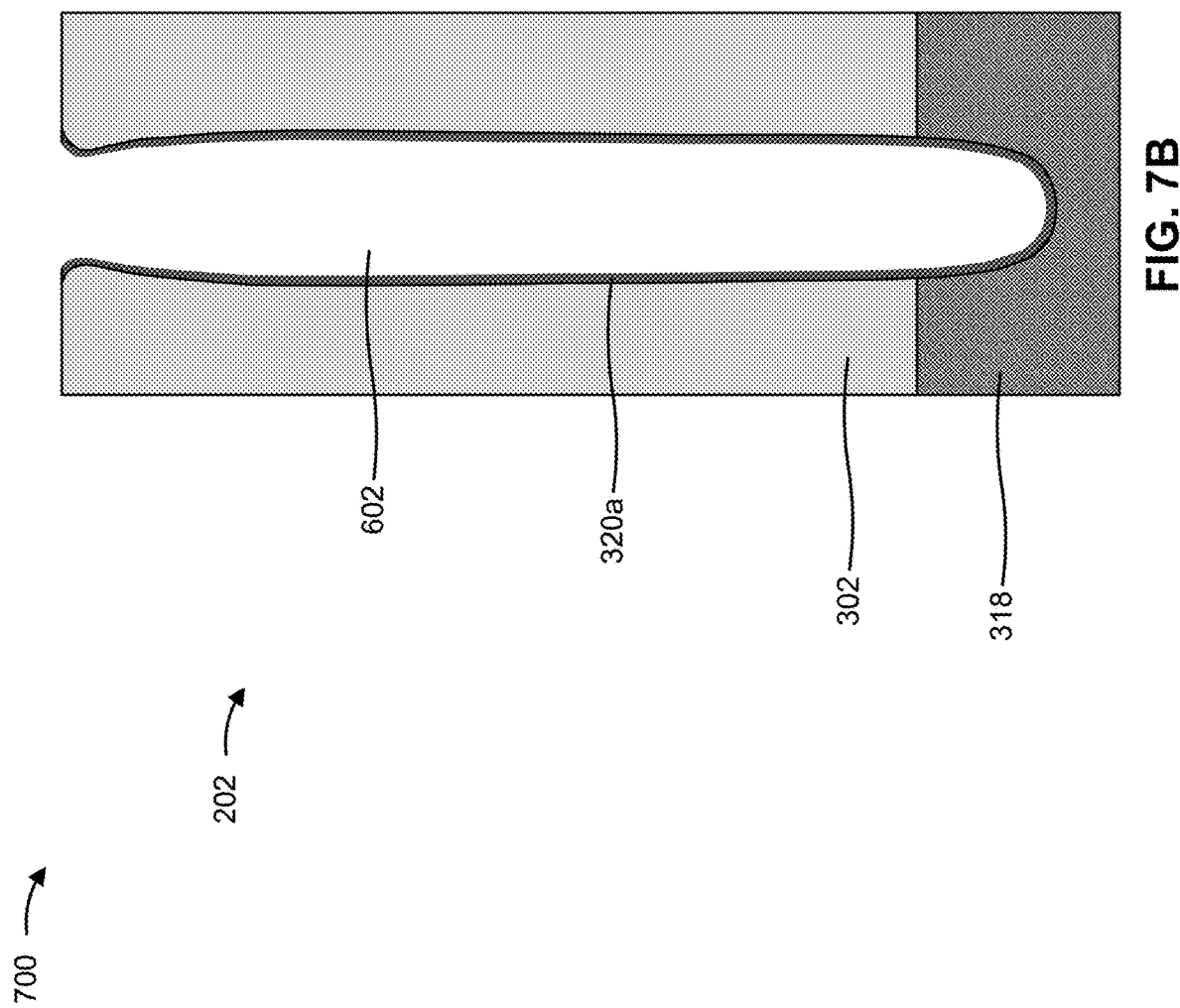

PRE-CLEANING FOR A DEEP TRENCH ISOLATION STRUCTURE IN A PIXEL SENSOR

BACKGROUND

A complementary metal oxide semiconductor (CMOS) image sensor may include a plurality of pixel sensors. A pixel sensor of the CMOS image sensor may include a transfer transistor, which may include a photodiode configured to convert photons of incident light into a photocurrent of electrons and a transfer gate configured to control the flow of the photocurrent between the photodiode and a drain region. The drain region may be configured to receive the photocurrent such that the photocurrent can be measured and/or transferred to other areas of the CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4E, 5A-5G, 6A-6G, and 7A-7G are diagrams of example implementations described herein.

DETAILED DESCRIPTION

Figure 1:
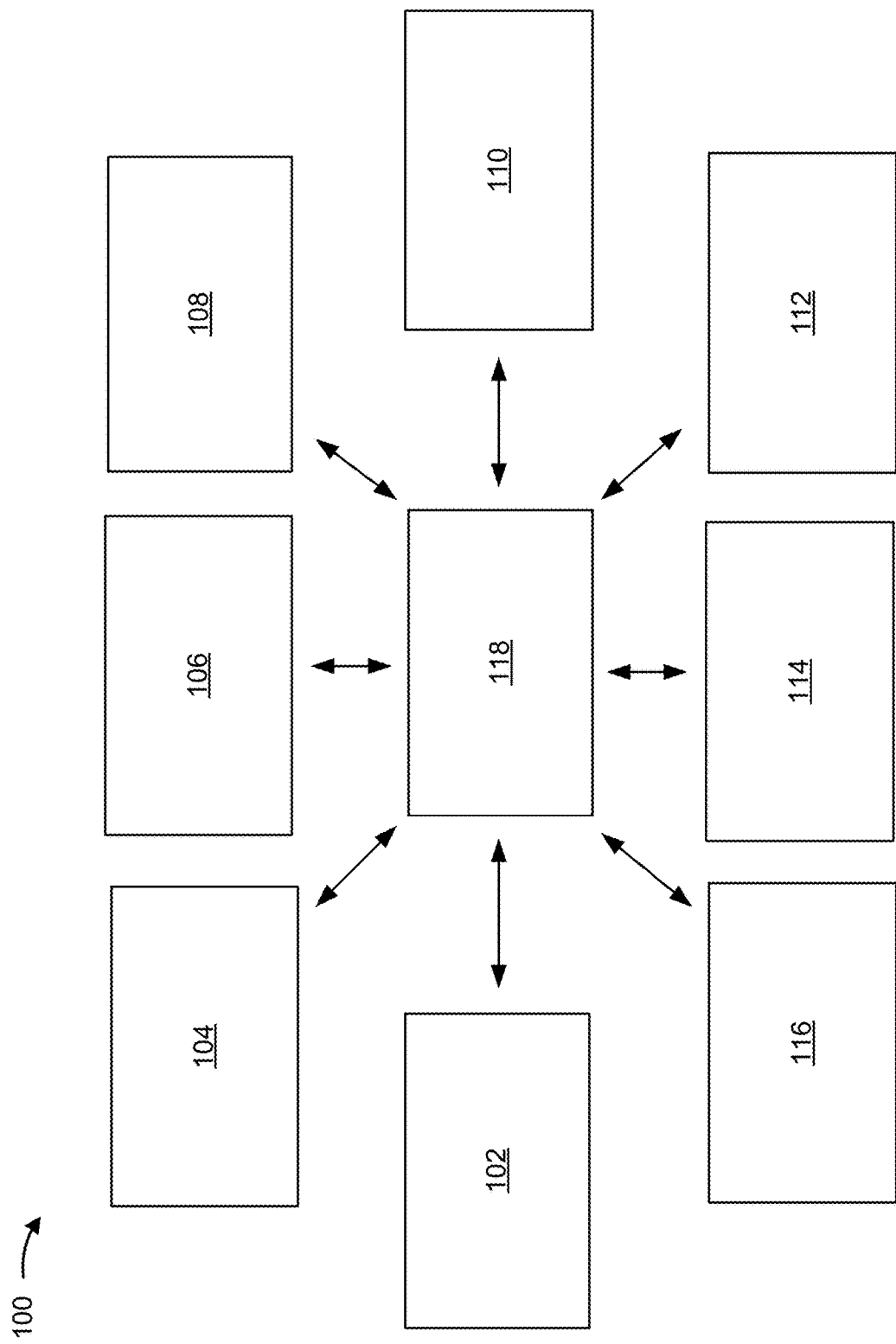
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Optical crosstalk can occur between adjacent pixel regions in a pixel array. Optical crosstalk is a pixel array performance issue, whereby incident light passes through a pixel sensor at a non-orthogonal angle and is at least partially absorbed by a photodiode of an adjacent pixel sensor. A pixel array may include deep trench isolation (DTI) structures between adjacent pixel sensors to reduce optical crosstalk and/or to increase photon absorption in a pixel sensor. However, in some cases, photons may still pass through (or diffuse through) a DTI structure, which may result in optical crosstalk between adjacent pixel sensors.

One or more passivation layers (e.g., boron (B) layers) may be epitaxially grown prior to filling a DTI structure (e.g., with an oxide material) for a pixel sensor. However, defects can occur when forming the passivation layers due to high oxygen concentration on the silicon (Si) substrate on which the passivation layers are formed. The defects may include reduced uniformity in the passivation layers, increased carbon concentration in the passivation layers, and/or dislocation of the passivation layers from the silicon substrate, among other examples. The defects may decrease the optical crosstalk mitigation performance of the DTI structure, which may result in increased dark current for the pixel sensor, reduced sensitivity for the pixel sensor, and/or reduced low-light performance for the pixel sensor, among other examples.

Some implementations described herein provide pre-cleaning techniques for forming a passivation layer for a DTI structure to enable optical crosstalk reduction for pixel sensors in a pixel array. As described herein, a boron (B) layer may be formed as a passivation layer in a recess in which a DTI structure is to be formed. The recess may then be filled with an oxide material over the boron layer (and/or one or more intervening layers) to form the DTI structure.

Prior to forming the passivation layer, a cyclic pre-cleaning technique may be used to clean sidewalls and bottom of the recess in which the passivation layer is to be formed. The cyclic pre-cleaning technique may include performing one or more deposition and etch cycles to remove oxygen from the surfaces of the sidewalls and bottom of the recess to reduce the oxygen concentration in the recess prior to forming the passivation layer.

Each deposition and etch cycle may include a deposition operation and an etch operation. In the deposition operation, a sacrificial germanium (Ge) layer is deposited in the recess. The germanium readily bonds with the oxygen in the surfaces of the sidewalls and bottom of the recess, which results in the formation of germanium oxide (GeO). In the etch operation, the germanium oxide is removed by volatile evaporation and residual silicon germanium (SiGe) is removed by hydrochloric acid-based etching. The deposition and etch cycles may be performed until a sufficient amount of oxygen is removed from the surfaces of the sidewalls and bottom of the recess. The passivation layer may then be formed in the recess.

The cyclic pre-cleaning technique described herein enables the recess, in which a DTI structure is to be formed, to be cleaned in preparation for deposition of a passivation layer. The cyclic pre-cleaning technique may reduce the oxygen concentration in the surfaces of the recess, which may increase the quality of the passivation layer, and may reduce defect formation during epitaxial growth of the passivation layer. Moreover, the cyclic pre-cleaning technique may reduce carbon contamination on the surfaces of the recess, which may reduce dislocation of the passivation layer from the surfaces of the recess. This may increase the crosstalk mitigation performance of the DTI structure, which may increase the overall performance of an image sensor in which the DTI structure is included. Moreover, the cyclic pre-cleaning technique enables the recess to be cleaned at a low temperature, which reduces the likelihood of damage being caused to other structures of the image sensor during cleaning of the recess.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, a plating tool 112, an ion implantation tool 114, an annealing tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The annealing tool 116 is a semiconductor processing tool that includes a semiconductor processing chamber and one or more devices capable of heating a semiconductor substrate or semiconductor device. For example, the annealing tool 116 may include a rapid thermal annealing (RTA) tool or another type of annealing tool that is capable of heating a semiconductor substrate to cause a reaction between two or more materials or gasses, to cause a material to decompose. As another example, the annealing tool 116 may be configured to heat (e.g., raise or elevate the temperature of) a structure or a layer (or portions thereof) to re-flow the structure or the layer, or to crystallize the structure or the layer, to remove defects such as voids or seams. As another example, the annealing tool 116 may be configured to heat (e.g., raise or elevate the temperature of) a layer (or portions thereof) to enable bonding of two or more semiconductor devices.

The wafer/die transport tool 118 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 118 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-116 and/or the wafer/die transport tool 118 may perform one or more semiconductor processing operations described herein. For example, one or more of the semiconductor processing tools 102-116 and/or the wafer/die transport tool 118 may form a trench in a substrate of a semiconductor device; may form a germanium layer over sidewalls and a bottom surface of the trench, where germanium of the germanium layer reacts with an oxide layer on the sidewalls and on the bottom surface to form a monolayer on the sidewalls and on the bottom surface of the trench, and where the monolayer includes germanium oxide (GeO$_x$); and/or may remove the monolayer from the sidewalls and from the bottom surface of the trench, among other examples.

As another example, one or more of the semiconductor processing tools 102-116 and/or the wafer/die transport tool 118 may form, in a substrate, a photodiode for a pixel sensor of a pixel array; may form, in the substrate, a drain region for the pixel sensor; may form, in the substrate, a trench adjacent to the photodiode and the drain region; may perform a pre-cleaning operation to remove a residual oxide layer from the trench, where the pre-cleaning operation includes using a plurality of deposition and etch cycles to absorb oxygen in the residual oxide layer using germanium; may form, after performing the pre-cleaning operation, a boron layer on sidewalls of the trench and on a bottom surface of the trench; and/or may fill the trench with an oxide material over the boron layer to form a DTI structure, among other examples.

As another example, one or more of the semiconductor processing tools 102-116 and/or the wafer/die transport tool 118 may form, for a pixel sensor, a photodiode in a silicon substrate; may form a drain region in the silicon substrate; may form a DTI structure in the silicon substrate, where the DTI structure surrounds the photodiode and the drain region, and where the DTI structure includes a boron layer and an oxide structure over the boron layer; and/or may form a silicon germanium (SiGe) layer at an interface between the boron layer and the silicon substrate, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. For example, a deposition tool 102 and an etch tool 108 may be included in a same semiconductor processing tool in which pre-cleaning is performed in a single chamber using cyclical deposition and etch operations, as described herein. Additionally, or alternatively, a set of devices (e.g., one or more devices) of the example environment 100 may perform one or more functions described as being performed by another set of devices of the example environment 100.

Figure 2:
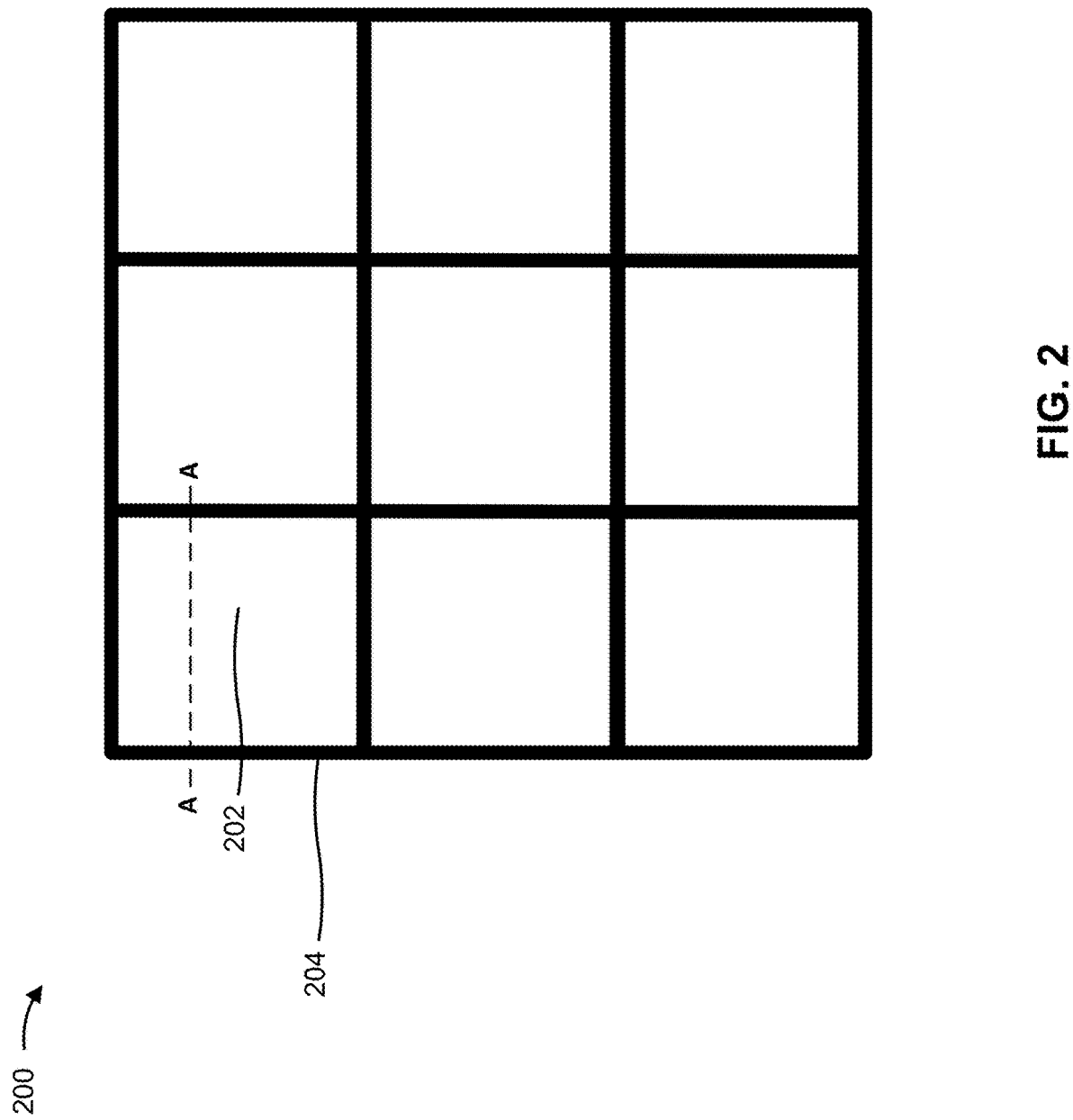
FIG. 2 is a diagram of an example pixel array described herein.

FIG. 2 is a diagram of an example pixel array 200. FIG. 2 illustrates a top-down view of the pixel array 200. In some implementations, the pixel array 200 may be included in an image sensor. The image sensor may include a complementary metal oxide semiconductor (CMOS) image sensor, a backside illuminated (BSI) CMOS image sensor, a front side illuminated (FSI) CMOS image sensor, or another type of image sensor. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as rectangle shapes, circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

In some implementations, the size of the pixel sensors 202 (e.g., the width or the diameter) of the pixel sensors 202 is approximately 1 micron. In some implementations, the size of the pixel sensors 202 (e.g., the width or the diameter) of the pixel sensors 202 is less than approximately 1 micron. In these examples, the pixel sensors 202 may be referred to as sub-micron pixel sensors. Sub-micron pixel sensors may decrease the pixel sensor pitch (e.g., the distance between adjacent pixel sensors) in the pixel array 200, which may enable increased pixel sensor density in the pixel array 200 (which can increase the performance of the pixel array 200).

The pixel sensors 202 may be electrically and optically isolated by a DTI structure 204 included in the pixel array 200. The DTI structure 204 may include a plurality of interconnected trenches that are filled with a dielectric material such as an oxide. The trenches of the DTI structure 204 may be included around the perimeters of the pixel sensors 202 such that the DTI structure 204 surrounds the pixel sensors 202 (and the photodiodes and drain regions included therein), as shown in FIG. 2. Moreover, the trenches of the DTI structure 204 may extend into a substrate in which the pixel sensors 202 are formed to surround the photodiodes and other structures of the pixel sensors 202 in the substrate. As indicated above, the pixel array 200 may be included in a BSI CMOS image sensor. In these examples, the DTI structure 204 may include a backside DTI (BDTI or BSDTI) structure with a high aspect ratio that is formed from the backside of the pixel array 200.

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal. For a BSI CMOS image sensor, the transistor layer may be located between the BEOL metallization stack layers and a lens layer. For a FSI CMOS image sensor, the BEOL metallization stack layers may be located between the transistor layer and the lens layer.

FIG. 2 further illustrates a reference cross-section A-A that is used in one or more figures described herein, such as one or more of FIGS. 3-50. Cross-section A-A is in a plane across a pixel sensor 202 of the pixel array 200. Subsequent figures refer to this reference cross-section for clarity. In some figures, some reference numbers of components or features illustrated therein may be omitted to avoid obscuring other components or features for ease of depicting the figures.

As indicated above, FIG. 2 is provided as an example. Other examples may differ from what is described with regard to FIG. 2.

Figure 3A:
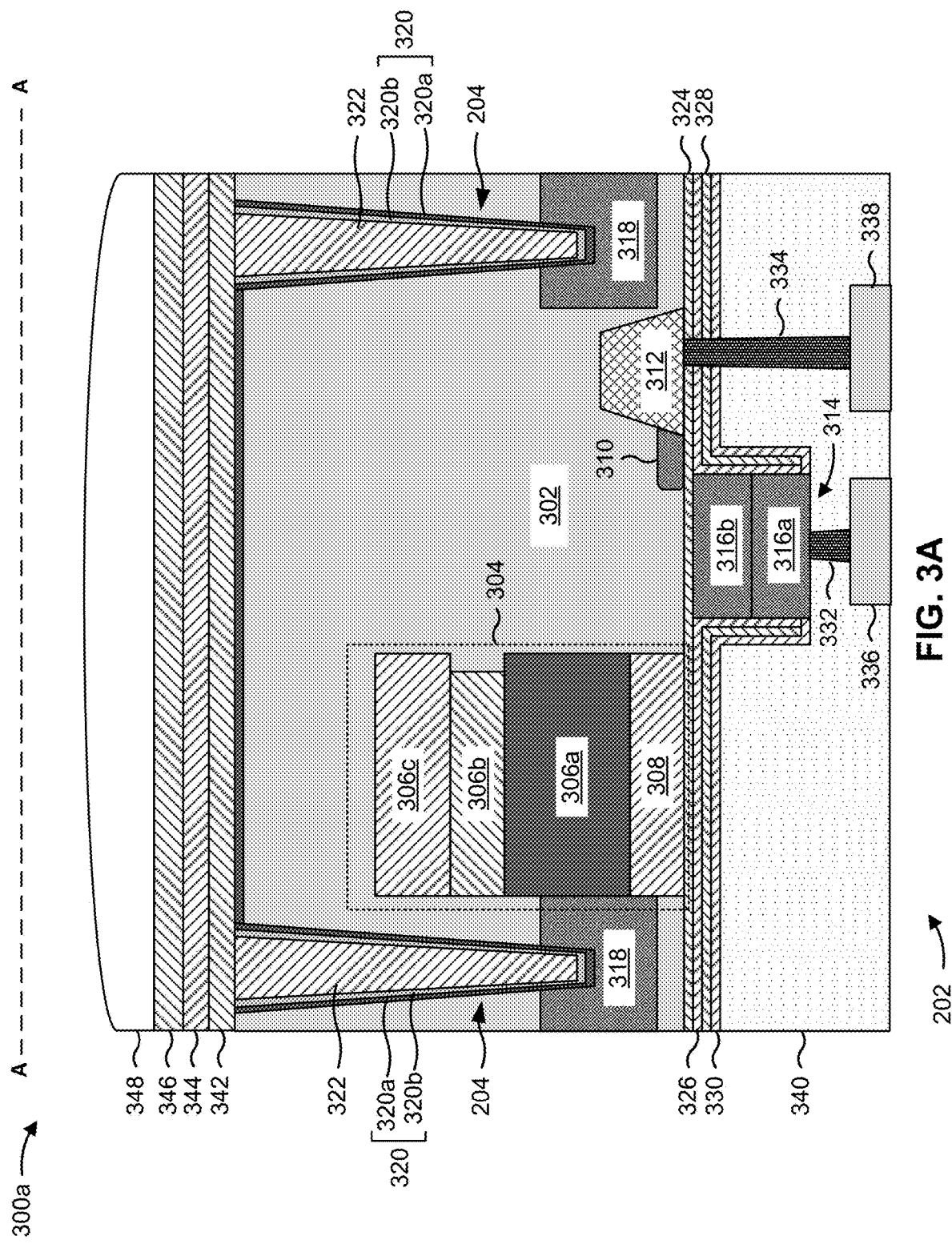
FIGS. 3A and 3B are diagrams of examples of a pixel sensor described herein.
Figure 3B:
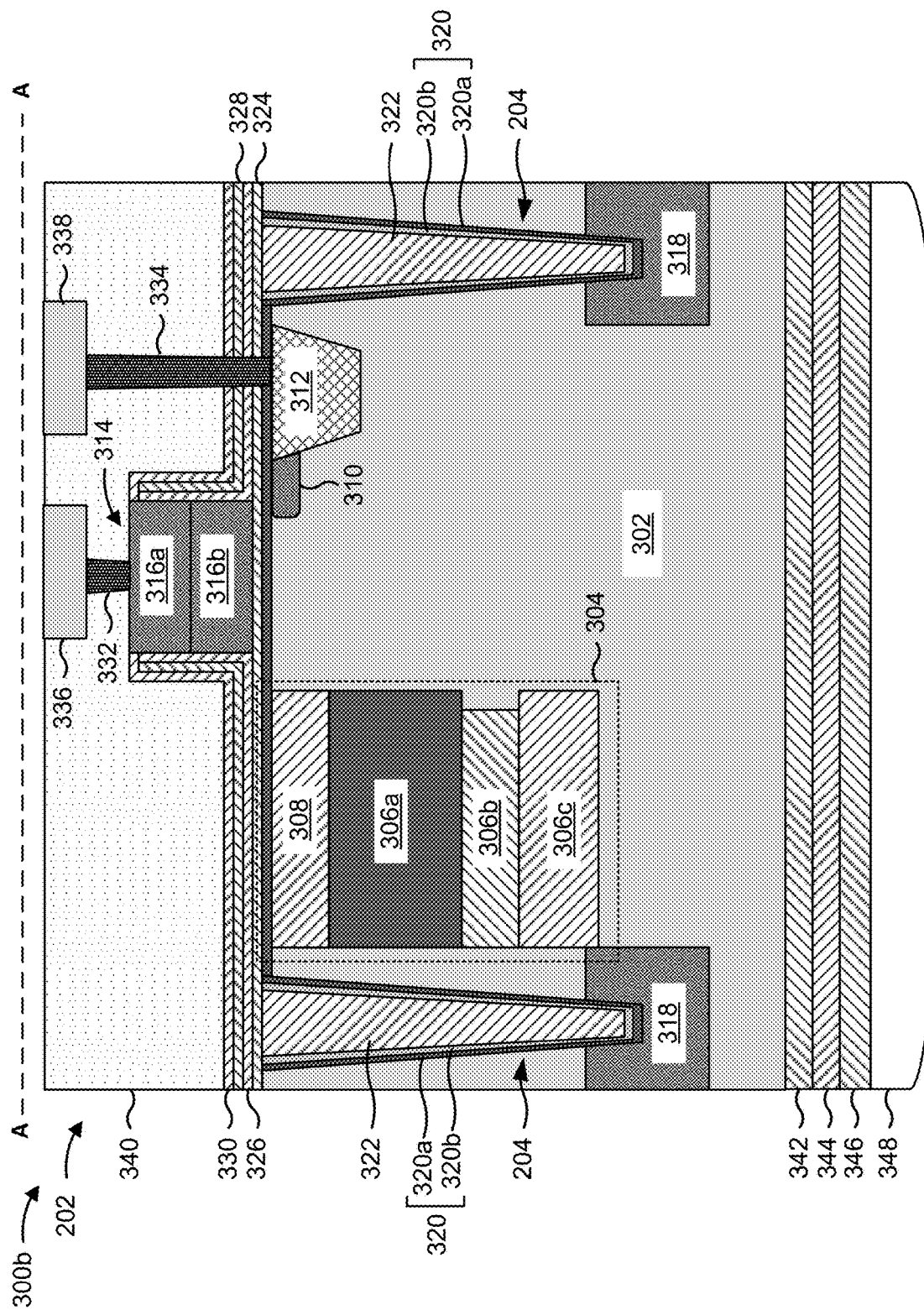

FIGS. 3A and 3B are diagrams of example configurations s of a pixel sensor 202 described herein. In particular, FIGS. 3A and 3B illustrate the example configurations in cross-section views of the pixel sensor 202 along the cross-section A-A of the pixel array 200 in FIG. 2. In some implementations, the pixel sensor 202 may be included in the pixel array 200. In some implementations, the pixel sensor 202 may be included in an image sensor. The image sensor may be a CMOS image sensor, a BSI CMOS image sensor, or another type of image sensor.

FIG. 3A includes an example configuration 300a of a backside DTI CMOS image sensor (BS-DTI-CIS) configuration for a pixel sensor 202. As shown in FIG. 3A, the pixel sensor 202 may include a substrate 302. The substrate 302 may include a semiconductor die substrate, a semiconductor wafer, a stacked semiconductor wafer, or another type of substrate in which semiconductor pixels may be formed. In some implementations, the substrate 302 is formed of silicon (Si) (e.g., a silicon substrate), a material including silicon, a III-V compound semiconductor material such as gallium arsenide (GaAs), a silicon on insulator (SOI), or another type of semiconductor material that is capable of generating a charge from photons of incident light. In some implementations, the substrate 302 is formed of a doped material (e.g., a p-doped material or an n-doped material) such as a doped silicon.

The pixel sensor 202 may include a photodiode 304 that is included in the substrate 302. The photodiode 304 may include a plurality of regions that are doped with various types of ions to form a p-n junction or a PIN junction (e.g., a junction between a p-type portion, an intrinsic (or undoped) type portion, and an n-type portion). For example, the substrate 302 may be doped with an n-type dopant to form one or more n-type regions 306 of the photodiode 304, and the substrate 302 may be doped with a p-type dopant to form a p-type region 308 of the photodiode 304. The photodiode 304 may be configured to absorb photons of incident light. The absorption of photons causes the photodiode 304 to accumulate a charge (referred to as a photocurrent) due to the photoelectric effect. Photons may bombard the photodiode 304, which causes emission of electrons in the photodiode 304.

The regions included in the photodiode 304 may be stacked and/or vertically arranged. For example, the p-type region 308 may be included over the one or more n-type regions 306. The p-type region 308 may provide noise isolation for the one or more n-type regions 306 and may facilitate photocurrent generation in the photodiode 304. In some implementations, the p-type region 308 (and thus, the photodiode 304) is spaced away (e.g., downward) from a top surface of the substrate 302 to provide noise isolation and/or light-leakage isolation from one or more upper layers of the pixel sensor 202. The gap between the top surface of the substrate 302 and the p-type region 308 may decrease charging of the pixel sensor 202, may decrease the likelihood of plasma damage to the photodiode 304, and/or may reduce the dark current of the pixel sensor 202 and/or the white pixel performance of the pixel sensor 202, among other examples.

The one or more n-type regions 306 may include an n-type region 306a, an n-type region 306b, and an n-type region 306c. The n-type region 306b may be located over and/or on the n-type region 306c, and the n-type region 306a may be located over and/or on the n-type region 306b. The n-type region 306b and the n-type region 306c may be referred to as deep n-type regions or deep n-wells and may extend the n-type region 306 of the photodiode 304. This may provide an increased area for photon absorption in the photodiode 304. Moreover, at least a subset of the one or more n-type regions 306 may have different doping concentrations. For example, the n-type region 306a may include a greater n-type dopant concentration relative to the n-type region 306b and the n-type region 306c, and the n-type region 306b may include a greater n-type dopant concentration relative to the n-type region 306c. As a result, an n-type dopant gradient is formed, which may increase the migration of electrons upward in the photodiode 304.

The pixel sensor 202 may include a drain extension region 310 and a drain region 312 coupled and/or electrically connected to the drain extension region 310. The drain extension region 310 may be adjacent to the drain region 312. The drain region 312 may include a highly-doped n-type region (e.g., an n$^+$ doped region). The drain extension region 310 may include lightly-doped n-type region(s) that facilitate the transfer of photocurrent from the n-type region 306a to the drain region 312. In some implementations, the drain extension region 310 is spaced away (e.g., downward) from a frontside surface of the substrate 302 to provide noise isolation and/or light-leakage isolation from one or more upper layers of the pixel sensor 202. The gap between the frontside surface of the substrate 302 and the drain extension region 310 may increase noise isolation for the drain extension region 310, may decrease random noise and/or random telegraph noise in the pixel sensor 202, may decrease the likelihood of plasma damage to the drain extension region 310, and/or may reduce the dark current of the pixel sensor 202 and/or the white pixel performance of the pixel sensor 202, among other examples.

The pixel sensor 202 may include a transfer gate 314 to control the transfer of photocurrent between the photodiode 304 and the drain region 312. The transfer gate 314 may be energized (e.g., by applying a voltage or a current to the transfer gate 314) to cause a conductive channel to form between the photodiode 304 and the drain extension region 310. The conductive channel may be removed or closed by de-energizing the transfer gate 314, which blocks and/or prevents the flow of photocurrent between the photodiode 304 and the drain region 312.

The transfer gate 314 may include a gate electrode stack that includes an n-doped upper transfer gate electrode region 316a and a lower transfer gate electrode region 316b. The lower transfer gate electrode region 316b may be included over a portion of the frontside surface of the substrate 302, and the n-doped upper transfer gate electrode region 316a may be located over and/or on the lower transfer gate electrode region 316b. The n-doped upper transfer gate electrode region 318a may include a layer of $n^+$ doped polysilicon. The lower transfer gate electrode region 316b may include a layer of polysilicon.

The pixel sensor 202 may include a plurality of regions to provide electrical isolation and/or optical isolation between the pixel sensor 202 and adjacent pixel sensors. The pixel sensor 202 may include a deep p-well region (DPW) 318 adjacent to, and at least partially surrounding, the photodiode 304. In some implementations, the pixel sensor 202 further includes a cell p-well region (CPW) above the deep p-well region 318. The deep p-well region 318 (and the cell p-well region, if included) may include a circle or ring shape in a top-down view in the substrate 302. The deep p-well region 318 (and the cell p-well region, if included) may each include a $p^+$ doped silicon material or another $p^+$ doped material.

The DTI structure 204 may be included in the substrate 302 adjacent to the photodiode 304 and the drain region 312. Moreover, the DTI structure 204 may be included above and/or partially in the deep p-well region 318. In some implementations, the DTI structure 204 may be included in a cell p-well region. The DTI structure 204 may include one or more trenches that extend downward into the substrate 302 (e.g., from a backside surface of the substrate 302), and that are that are adjacent the photodiode 304, the drain extension region 310, and the drain region 312. In a top-down view of the pixel sensor 202, the DTI structure 204 may surround the photodiode 304, the drain extension region 310, and the drain region 312. In other words, the photodiode 304, the drain extension region 310, and the drain region 312 may be included within a perimeter of the DTI structure 204 of the pixel sensor 202. The DTI structure 204 may provide optical isolation between the pixel sensor 202 and one or more adjacent pixel sensors to reduce the amount of optical crosstalk between the pixel sensor 202 and the one or more adjacent pixel sensors. In particular, the DTI structure 204 may absorb, refract, and/or reflect photons of incident light, which may reduce the amount of incident light that travels through a pixel sensor 202 into an adjacent pixel sensor and is absorbed by the adjacent pixel sensor.

The DTI structure 204 may include one or more layers 320 between the substrate 302 of the pixel sensor 202 and an oxide layer 322 of the DTI structure 204. The one or more layers 320 may include a passivation layer 320a and a capping layer 320b, among other examples. The passivation layer 320a may be included between the substrate 302 (e.g., the silicon substrate) of the pixel sensor 202 and the capping layer 320b. The capping layer 320b may be included between the passivation layer 320a and the oxide layer 322. The passivation layer 320a may also be included on the backside of the pixel sensor 202 (e.g., on the backside surface of the substrate 302), as shown in the example in FIG. 3A.

The passivation layer 320a may include a boron (B) material, an amorphous boron (a-B) material, and/or another material. The capping layer 320b may include a silicon (Si) material, an amorphous silicon (a-Si) material, and/or another material. The passivation layer 320a may be included to further decrease optical crosstalk by providing a boron-silicon interface between the passivation layer 320a and the substrate 302. The boron-silicon interface resists, reduces, and/or minimizes penetration and/or diffusion of photons into the oxide layer 322. The capping layer 320b may be included to protect the passivation layer 320a from damage during one or more semiconductor processing operations for forming the pixel sensor 202. The passivation layer 320a (e.g., an amorphous boron layer) may be included on the back side of the pixel sensor 202 (e.g., on the back side of the substrate), as shown in the example in FIG. 3A.

The oxide layer 322 may function to reflect incident light toward the photodiode 304 to increase the quantum efficiency of the pixel sensor 202 and to reduce optical crosstalk between the pixel sensor 202 and one or more adjacent pixel sensors. In some implementations, the oxide layer 322 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another type of dielectric material is used in place of the oxide layer 322.

A gate dielectric layer 324 may be included above and/or over the frontside surface of the substrate 302. The lower transfer gate electrode region 316b may be included over and/or on the gate dielectric layer 324. The gate dielectric layer 324 may include a dielectric material such as tetraethyl orthosilicate (TEOS) or another type of dielectric material. A sidewall oxide layer 326 may be included over and/or the gate dielectric layer 324 on the frontside surface of the substrate 302. The sidewall oxide layer 326 may also be included on sidewalls of the n-doped upper transfer gate electrode region 316a and/or on sidewalls of the lower transfer gate electrode region 316b. The sidewall oxide layer 326 may include an oxide such as silicon oxide ($SiO_x$) or another type of oxide material. A remote plasma oxide (RPO) layer 328 may be included over and/or on the sidewall oxide layer 326 over the frontside surface of the substrate 302. The remote plasma oxide layer 328 may also be included over the sidewall oxide layer 326 on the sidewalls of the n-doped upper transfer gate electrode region 316a and/or over the sidewall oxide layer 326 on the sidewalls of the lower transfer gate electrode region 316b. A contact etch stop layer (CESL) 330 may be included over and/or on the remote plasma oxide layer 328 over the frontside surface of the substrate 302. The contact etch stop layer 330 may also be included over the remote plasma oxide layer 328 on the sidewalls of the n-doped upper transfer gate electrode region 316a and/or over remote plasma oxide layer 328 on the sidewalls of the lower transfer gate electrode region 316b.

The transfer gate 314 and the drain region 312 may be electrically connected by interconnects 332 and 334, respectively, with respective metallization layers 336 and 338 above the substrate 302. The interconnect 332 may be electrically connected with the transfer gate 314 by the n-doped upper transfer gate electrode region 316a. The interconnects 332 and 334, and the metallization layers 336 and 338, may be included in one or more dielectric layers 340. The dielectric layer(s) surround and/or encapsulate the interconnects 332 and 334, as well as the metallization layers 336 and 338. The dielectric layer may include an inter-metal dielectric (IMD) layer formed of an oxide material such as a silicon oxide ($SiO_x$) (e.g., silicon dioxide ($SiO_2$)), a silicon nitride ($SiN_x$), a silicon carbide ($SiC_x$), a titanium nitride ($TiN_x$), a tantalum nitride ($TaN_x$), a hafnium oxide ($HfO_x$), a tantalum oxide ($TaO_x$), or an aluminum oxide (AlO$_x$), or another type of dielectric material. The interconnects 332 and 334, as well as the metallization layers 336 and 338, may include one or more conductive materials, such as tungsten (W), cobalt (Co), ruthenium (Ru), copper (Cu), and/or another type of conductive material.

As further shown in FIG. 3A, the pixel sensor 202 may include one or more layers on the backside or a bottom side of the substrate 302. On the substrate 302 (e.g., on the backside of the substrate 302), a p$^+$ ion layer 342 may be included to increase photon-electron conversion. An antireflective coating (ARC) layer 344 may be included above and/or on the p$^+$ ion layer 342. The ARC 344 may include a suitable material for reducing a reflection of incident light projected toward the photodiode 304. For example, the ARC 344 may include nitrogen-containing material.

A color filter layer 346 may be included above and/or on the ARC 344. In some implementations, the color filter layer 346 includes a visible light color filter configured to filter a particular wavelength or a particular wavelength range of visible light (e.g., red light, blue light, or green light). In some implementations, the color filter layer 346 includes a near infrared (NIR) filter (e.g., an NIR bandpass filter) configured to permit wavelengths associated with NIR light to pass through the color filter layer 346 and to block other wavelengths of light. In some implementations, the color filter layer 346 includes an NIR cut filter configured to block NIR light from passing through the color filter layer 346. In some implementations, the color filter layer 346 is omitted from the pixel sensor 202 to permit all wavelengths of light to pass through to the photodiode 304. In these examples, the pixel sensor 202 may be configured as a white pixel sensor.

A micro-lens layer 348 may be included above and/or on the color filter layer 346. The micro-lens layer 348 may include a micro-lens for the pixel sensor 202 configured to focus incident light toward the photodiode 304 and/or to reduce optical crosstalk between the pixel sensor 202 and one or more adjacent pixel sensors.

In operation of the pixel sensor 202, a photocurrent generated by photons of incident light absorbed in the photodiode 304 may originate in the one or more n-type regions 306a-306c. A current (or voltage) may be applied to the transfer gate 314 from the metallization layer 336 through an interconnect 332, the n-doped upper transfer gate electrode region 316a, and the lower transfer gate electrode region 316b. The current (or voltage) may energize the transfer gate 314, which causes an electric field to form a conductive channel in the substrate 302 between the n-type region 306a and the drain extension region 310. The photocurrent may traverse along the conductive channel from the n-type region 306a to the drain extension region 310. The photocurrent may traverse from the drain extension region 310 to the drain region 312. The photocurrent may be measured through the interconnect 334 at the metallization layer 338.

FIG. 3B includes an example configuration 300b of a front side DTI CMOS image sensor (FS-DTI-CIS) configuration for a pixel sensor 202. In the example configuration 300b, the DTI structure 320 is formed in the substrate 302 from a front side or top side of the substrate 302. In the example configuration 300b, the p-type region 308 may be included over the one or more n-type regions 306. The n-type region 306b may be included over and/or on the n-type region 306c, the n-type region 306a may be included over and/or on the n-type region 306b. The p-type region 308 may be included over and/or on the n-type region 306a.

As further shown in FIG. 3B, the pixel sensor 202 may include one or more layers on the front side or a bottom side of the substrate 302. On the substrate 302 (e.g., on the top of the substrate 302), a p$^+$ ion layer 342 may be included to increase photon-electron conversion. An antireflective coating (ARC) layer 344 may be included above and/or on the p$^+$ ion layer 342. A color filter layer 346 may be included above and/or on the ARC 344. A micro-lens layer 348 may be included above and/or on the color filter layer 346.

As indicated above, FIGS. 3A and 3B are provided as example. Other examples may differ from what is described with regard to FIGS. 3A and 3B.

Figure 4A:
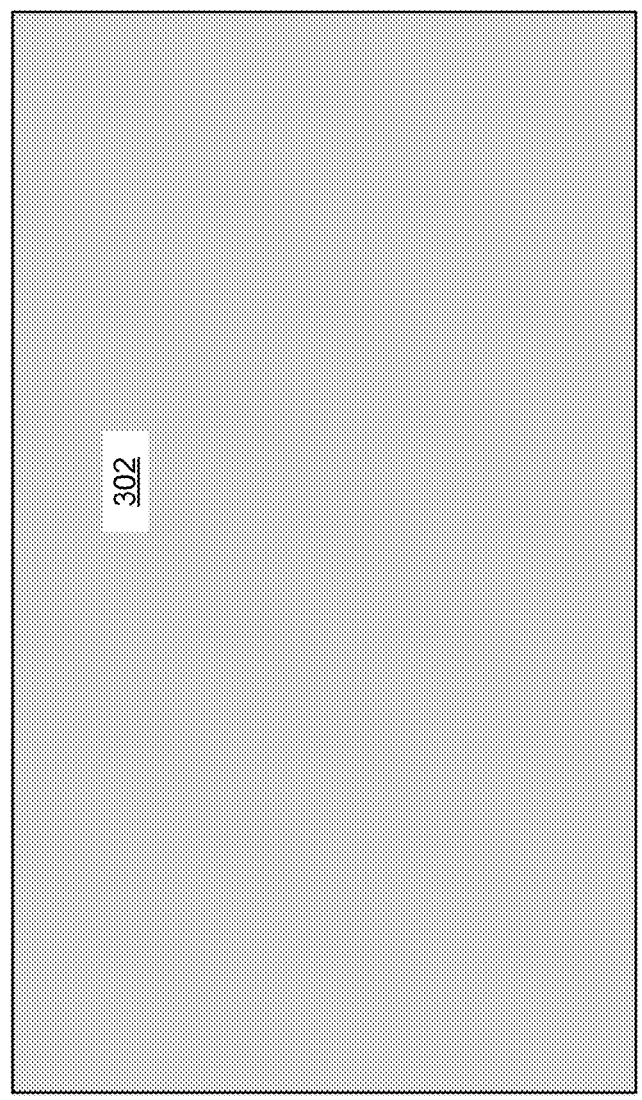
Figure 4B:
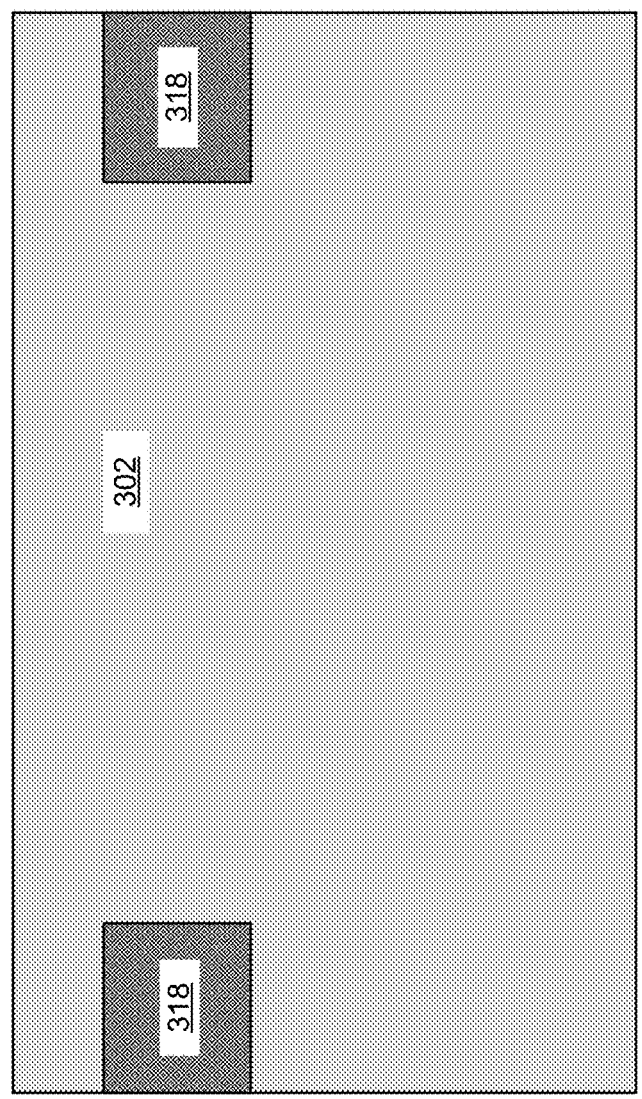
Figure 4C:
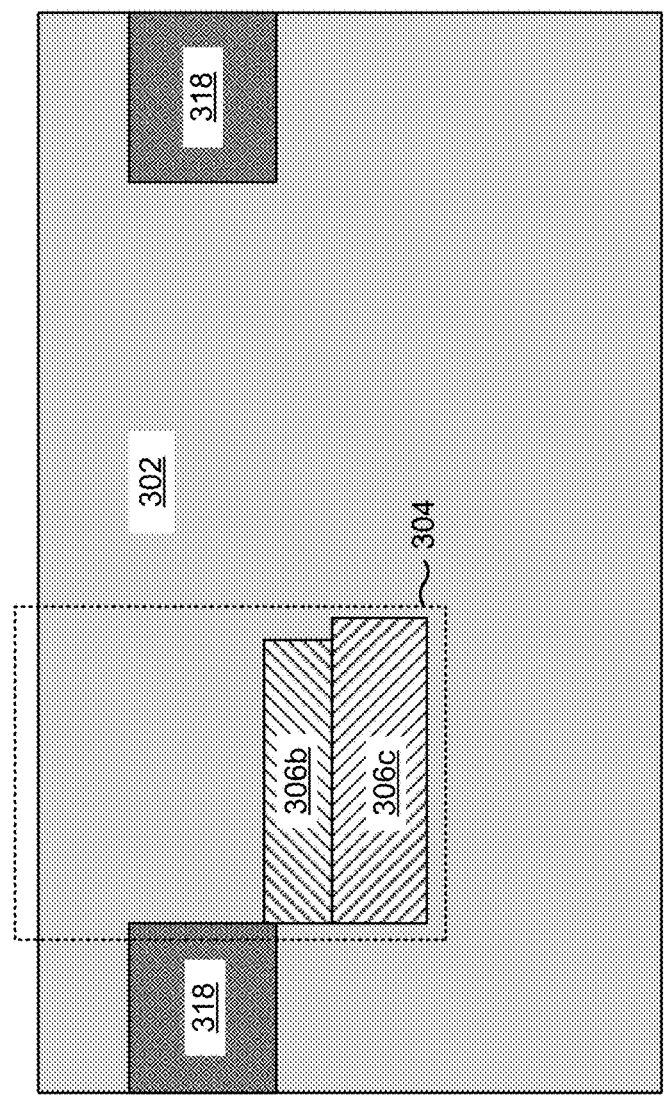
Figure 4D:
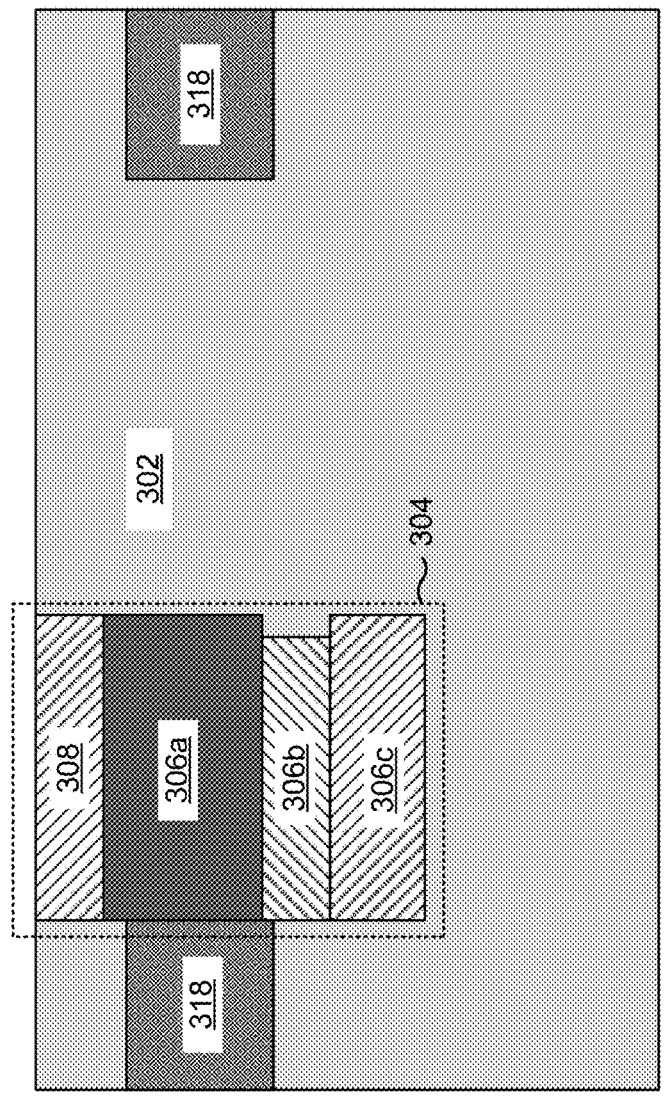
Figure 4E:
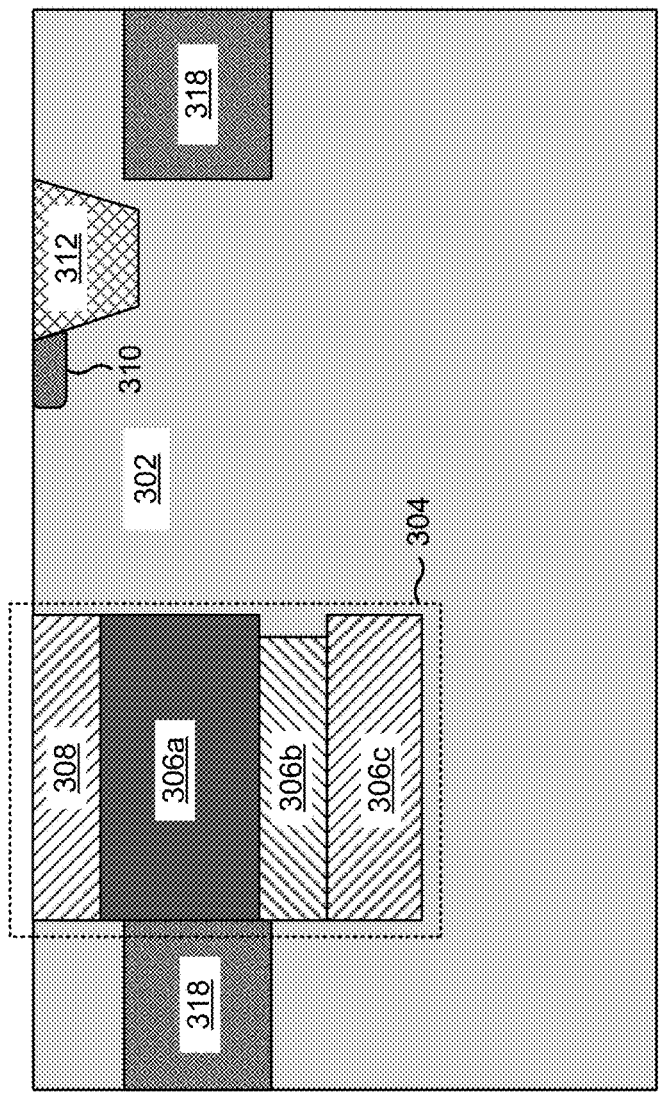

FIGS. 4E-4E are diagrams of an example implementation 400 described herein. Example implementation 400 may be an example process for forming a portion of a pixel sensor 202 described herein, such as the pixel sensor 202 described in connection with FIGS. 3A and/or 3B. One or more of FIGS. 4E-4E are illustrated along the cross-section A-A of the pixel array 200 in FIG. 2. As shown in FIG. 4A, the example process for forming the pixel sensor 202 may be performed in connection with the substrate 302.

As shown in FIG. 4B, the deep p-well region (DPW) 318 may be formed in the substrate 302. For example, the deep p-well region 318 may be formed (e.g., as a circle or ring shape in a top-down view) in the substrate 302 to provide electrical isolation and/or optical isolation for the pixel sensor 202. In some implementations, the ion implantation tool 114 dopes the substrate 302 by ion implantation to form the deep p-well region 318. For example, the ion implantation tool 114 may implant p$^+$ ions into a first region of the substrate 302 to form the deep p-well region 318. In some implementations, the ion implantation tool 114 dopes a portion of the substrate 302 above the deep p-well region 318 with p$^+$ ions to form a cell p-well region (CPW) above and/or over the deep p-well region 318. In some implementations, the substrate 302 may be doped using another doping technique such as diffusion to form the deep p-well region 318.

As shown in FIGS. 4C and 4D, a plurality of regions of the substrate 302 may be doped to form the photodiode 304. For example, and as illustrated in the example in FIG. 4C, the substrate 302 may be doped to form one or more n-type regions 306b and 306c. As another example, and as illustrated in the example in FIG. 4D, the substrate 302 may be doped to form an n-type region 306a and a p-type region 308.

In some implementations, the ion implantation tool 114 dopes the plurality of regions of the substrate 302 by one or more ion implantation operations. For example, the ion implantation tool 114 may implant p$^+$ ions in the substrate 302 to form the p-type region 308, may implant n$^+$ ions in the substrate to form the n-type region 306a over and/or on the p-type region 308, may implant n$^+$ ions in the substrate 302 to form the n-type region 306b above and/or over the n-type region 306a, and/or may implant n$^+$ ions in the substrate 302 to form the n-type region 306c above and/or over the n-type region 306b for a BS-DTI-CIS pixel sensor. As another example, the ion implantation tool 114 may implant n$^+$ ions in the substrate 302 to form the n-type region 306c, may implant n$^+$ ions in the substrate 302 to form the n-type region 306b above and/or over the n-type region 306c, may implant n$^+$ ions in the substrate 302 to form the n-type region 306a above and/or over the n-type region 306b, and may implant p$^+$ ions in the substrate 302 to form the p-type region 308 above and/or over the n-type region 306a for a FS-DTI-CIS pixel sensor. The ion implantation tool 114 may form the n-type region 306a, the n-type region 306b, the n-type region 306c, and the p-type region 308 within the perimeter of the deep p-well region 318. In some implementations, the plurality of regions of the substrate 302 may be doped using another doping technique such as diffusion to form the photodiode 304. In some implementations, the n-type region 306a, the n-type region 306b, and/or the n-type region 306c may be doped with different n-type dopant concentrations.

As shown in FIG. 4E, a plurality of regions of the substrate 302 may be doped to form the drain extension region 310 and the drain region 312. In some implementations, the ion implantation tool 114 dopes the plurality of regions of the substrate 302 by one or more ion implantation operations. For example, the ion implantation tool 114 may implant $n^+$ ions in the substrate 302 to form the drain region 312, and may implant $n^+$ ions in the substrate 302 adjacent to the drain region 312 to form the drain extension region 310. The ion implantation tool 114 may form the drain region 312 and the drain extension region 310 within the perimeter of the deep p-well region 318. In some implementations, the plurality of regions of the substrate 302 may be doped using another doping technique such as diffusion to form the drain region 312 and/or the drain extension region 310. In some implementations, the drain extension region 310 and the drain region 312 may be doped with different n-type dopant concentrations.

As indicated above, FIGS. 4A-4E are provided as example. Other examples may differ from what is described with regard to FIGS. 4A-4E.

FIGS. 5A-5G are diagrams of an example implementation 500 described herein. Example implementation 500 may be an example process for forming a portion of a pixel sensor 202 described herein, such as the pixel sensor 202 described in connection with FIGS. 3A and/or 3B. One or more of FIGS. 5A-5G are illustrated along the cross-section A-A of the pixel array 200 in FIG. 2. In some implementations, the operations described in connection with FIGS. 5A-5G may be performed after the operations described in connection with FIGS. 4A-4E.

Figure 5A:
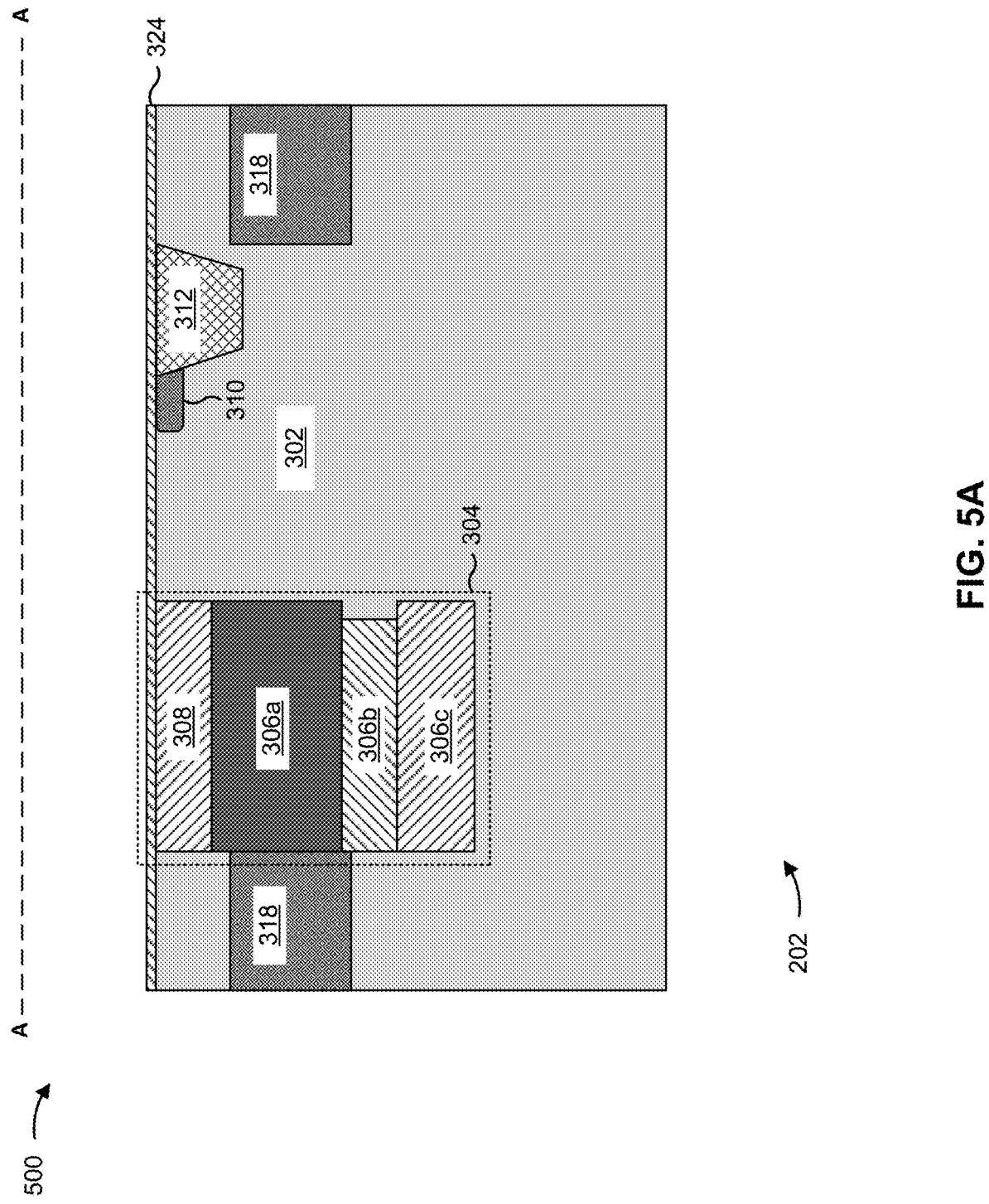

As shown in FIG. 5A, the gate dielectric layer 324 may be formed above and/or over the frontside surface of the substrate 302. The deposition tool 102 may deposit the gate dielectric layer 324 using a CVD technique, a PVD technique, an ALD technique, or another type of deposition technique. The planarization tool 110 may planarize the gate dielectric layer 324 after the gate dielectric layer 324 is deposited.

Figure 5B:
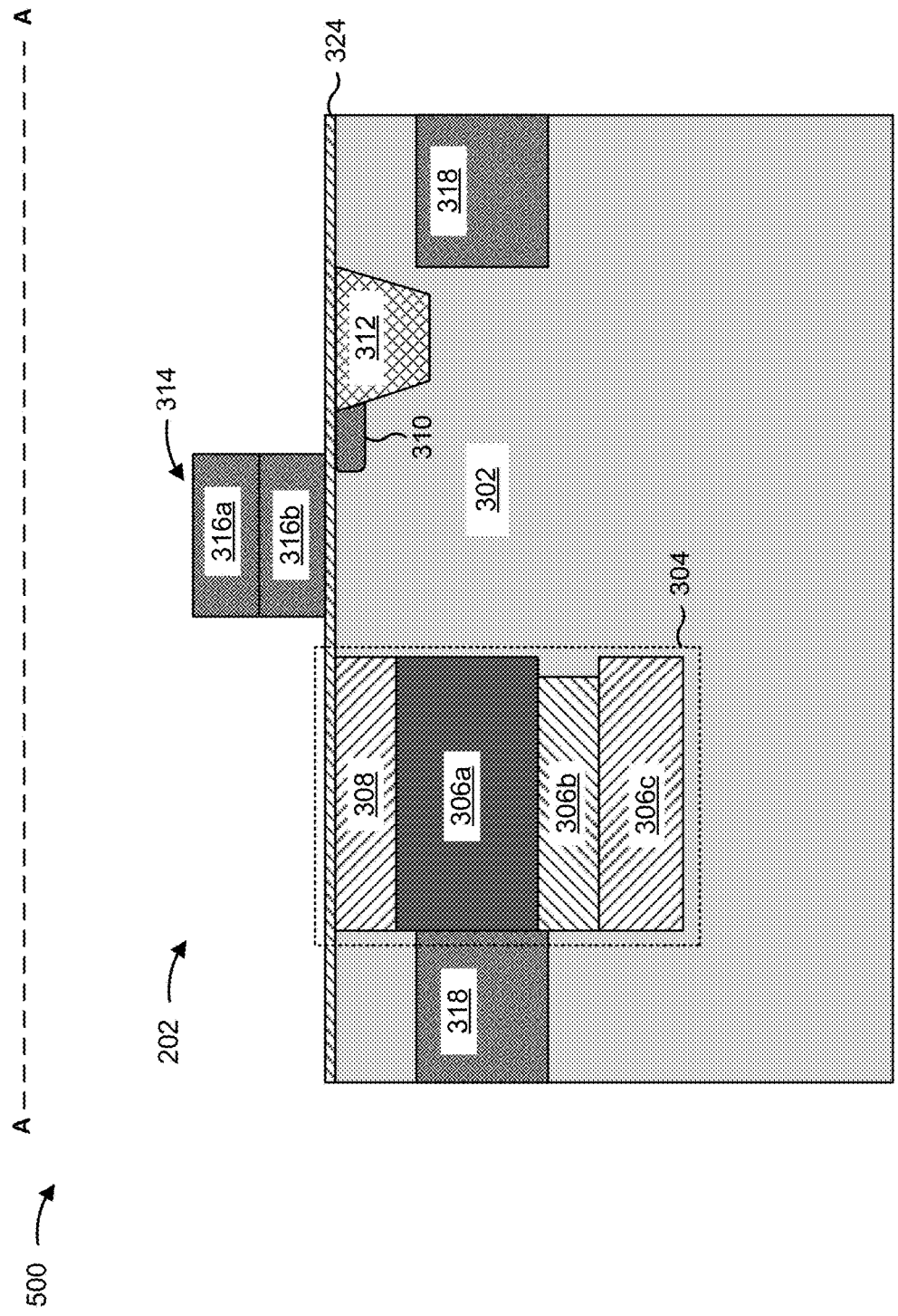

As shown in FIG. 5B, the transfer gate 314 may be formed over and/or on the gate dielectric layer 324. Moreover, the transfer gate 314 may be formed such that the transfer gate 314 is above and between the photodiode 304 and the drain region 312. This enables the transfer gate 314 to selectively form a conductive channel in the substrate 302 between the photodiode 304 and the drain region 312 to control the flow of electrons from the photodiode 304 to the drain region 312.

Forming the transfer gate 314 may include forming the lower transfer gate electrode region 316b over and/or on the gate dielectric layer 324, and forming the n-doped upper transfer gate electrode region 316a over and/or on the lower transfer gate electrode region 316b. The deposition tool 102 may deposit the n-doped upper transfer gate electrode region 316a and/or the lower transfer gate electrode region 316b using a CVD technique, a PVD technique, an ALD technique, an epitaxy technique, or another type of deposition technique; the plating tool 112 may deposit the transfer gate 314 in an electroplating operation; or a combination thereof. In some implementations, the ion implantation tool 114 forms the n-doped upper transfer gate electrode region 316a and/or the lower transfer gate electrode region 316b using one or more ion implantation operations. In some implementations, the planarization tool 110 planarizes the n-doped upper transfer gate electrode region 316a and/or the lower transfer gate electrode region 316b after formation of the n-doped upper transfer gate electrode region 316a and/or the lower transfer gate electrode region 316b.

Figure 5C:
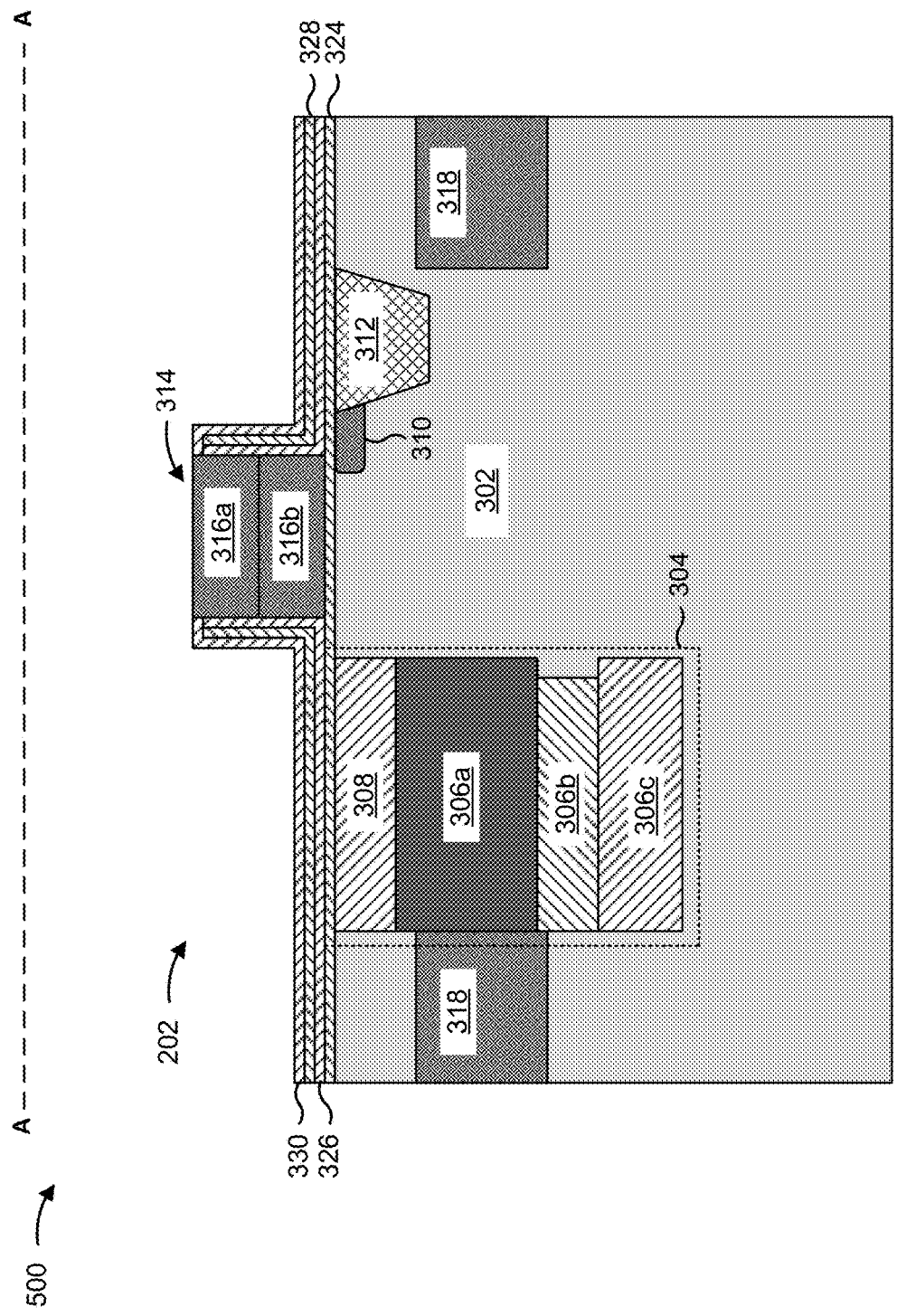

As shown in FIG. 5C, the sidewall oxide layer 326 may be formed over and/or on the gate dielectric layer 324, on the sidewalls of the n-doped upper transfer gate electrode region 316a, and on the sidewalls of the lower transfer gate electrode region 316b. The deposition tool 102 may deposit the sidewall oxide layer 326 using a CVD technique, a PVD technique, an ALD technique, or another type of deposition technique. In some implementations, the deposition tool 102 deposits the sidewall oxide layer 326 using a conformal deposition technique. In some implementations, the planarization tool 110 planarizes the sidewall oxide layer 326 after the sidewall oxide layer 326 is deposited.

As further shown in FIG. 5C, the remote plasma oxide (RPO) layer 328 may be formed over and/or on the sidewall oxide layer 326, over the sidewalls of the n-doped upper transfer gate electrode region 316a, and over the sidewalls of the lower transfer gate electrode region 316b. The deposition tool 102 may deposit the remote plasma oxide layer 328 using a CVD technique, a PVD technique, an ALD technique, or another type of deposition technique. In some implementations, the deposition tool 102 deposits the remote plasma oxide layer 328 using a conformal deposition technique. In some implementations, the planarization tool 110 planarizes the remote plasma oxide layer 328 after the remote plasma oxide layer 328 is deposited.

As further shown in FIG. 5C, the contact etch stop layer (CESL) 330 may be formed over and/or on the remote plasma oxide layer 328, over the sidewalls of the n-doped upper transfer gate electrode region 316a, and over the sidewalls of the lower transfer gate electrode region 316b. The deposition tool 102 may deposit the contact etch stop layer 330 using a CVD technique, a PVD technique, an ALD technique, or another type of deposition technique. In some implementations, the deposition tool 102 deposits the contact etch stop layer 330 using a conformal deposition technique. In some implementations, the planarization tool 110 planarizes the contact etch stop layer 330 after the contact etch stop layer 330 is deposited.

Figure 5D:
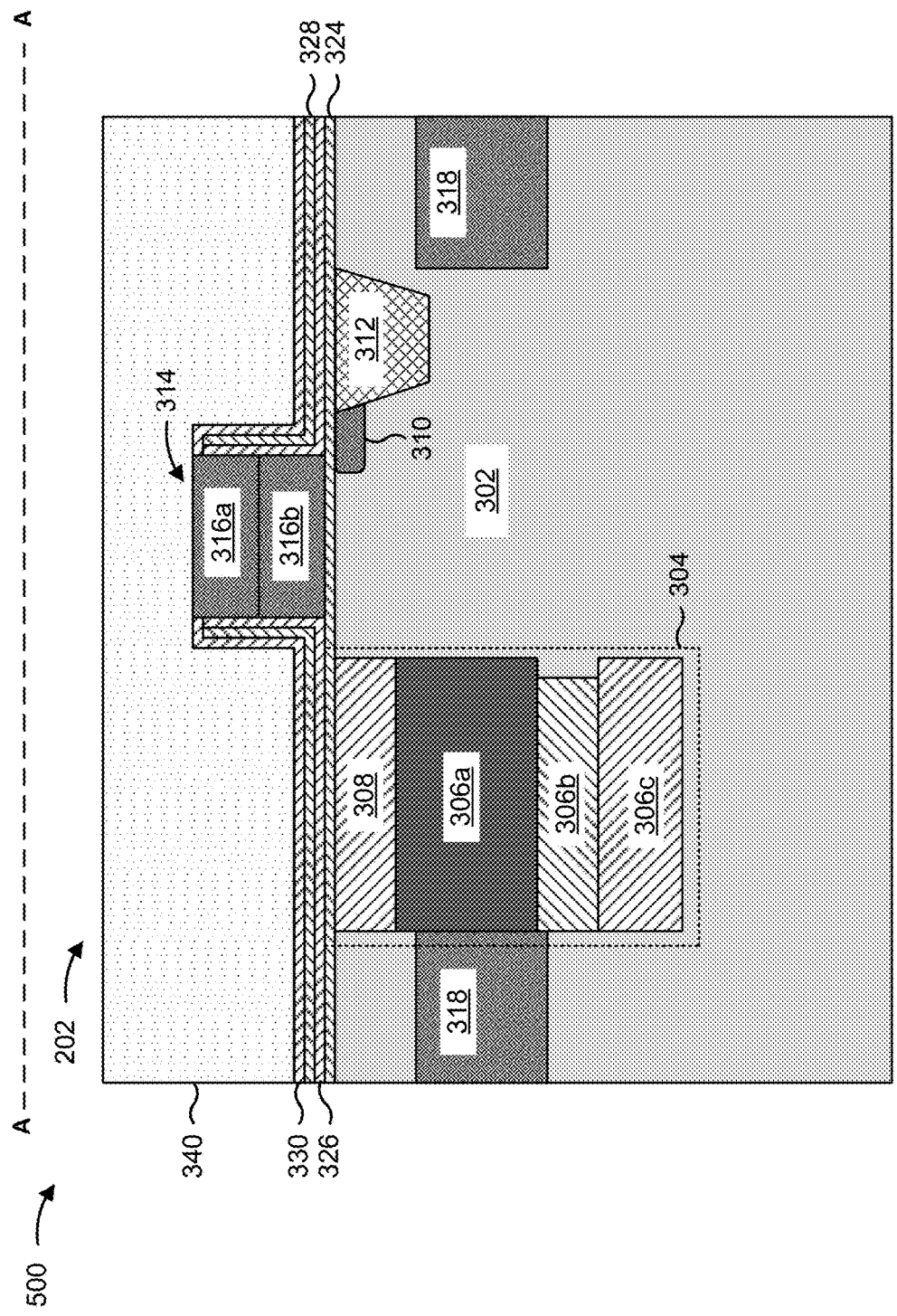
Figure 5E:
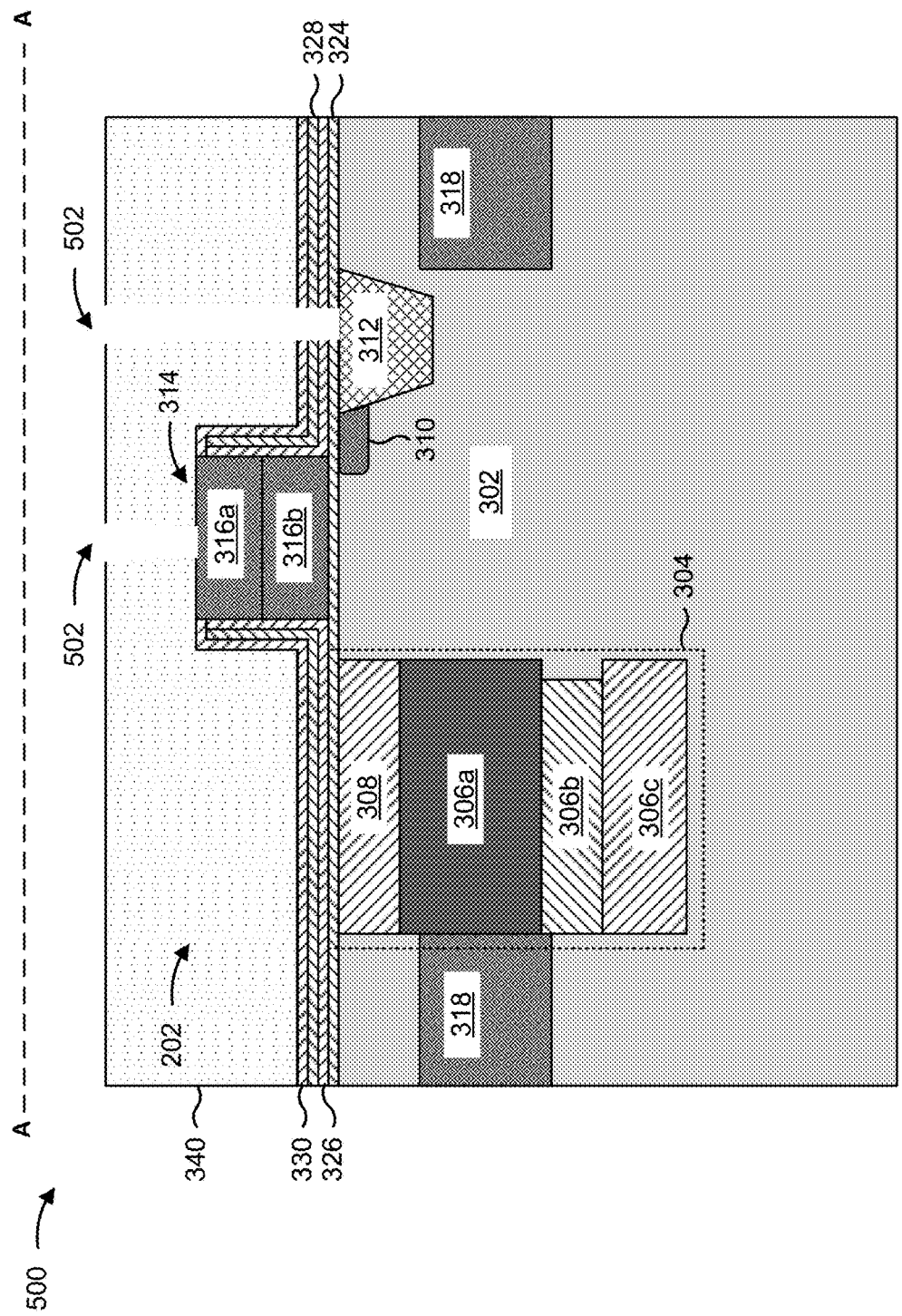
Figure 5F:
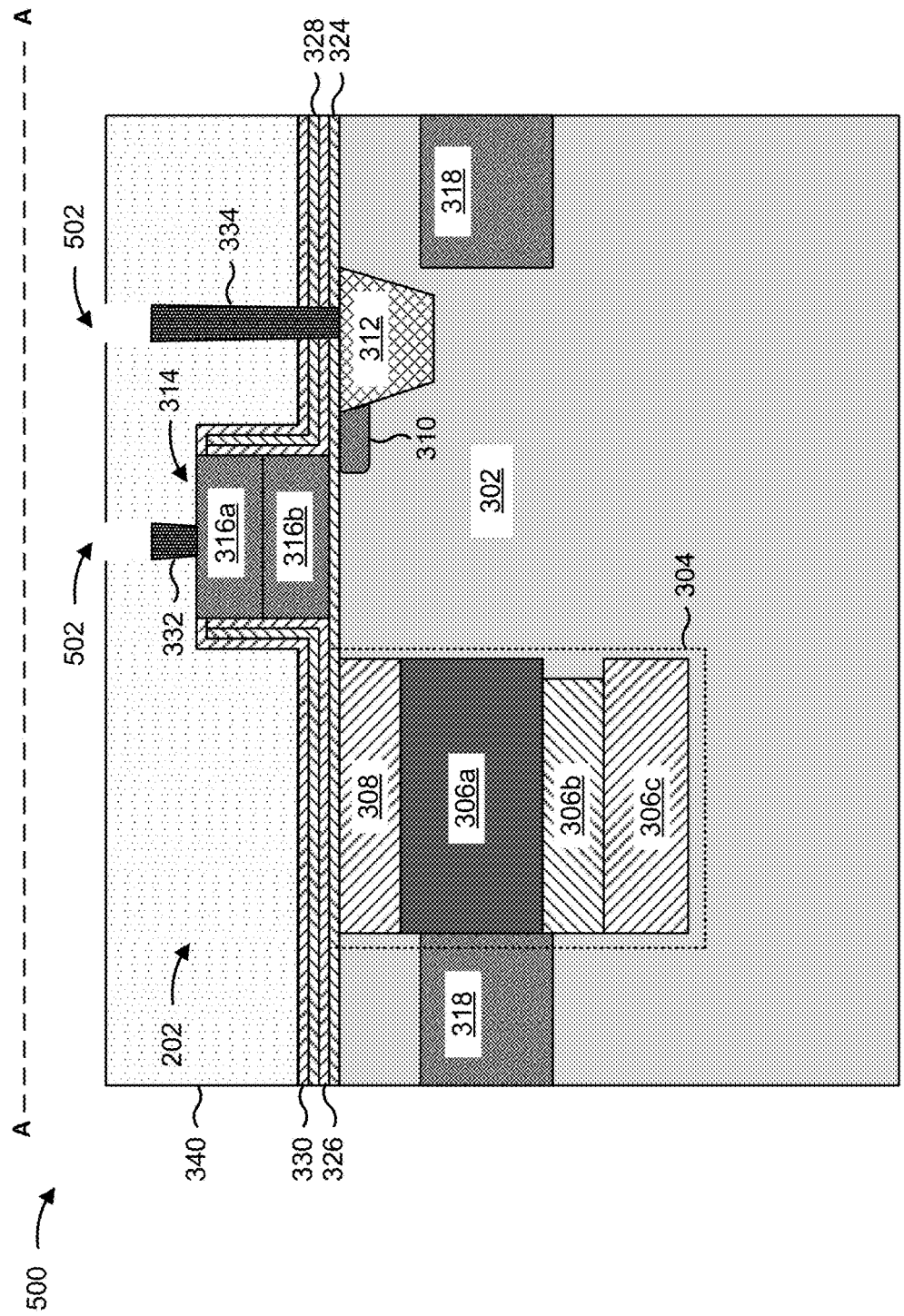
Figure 5G:
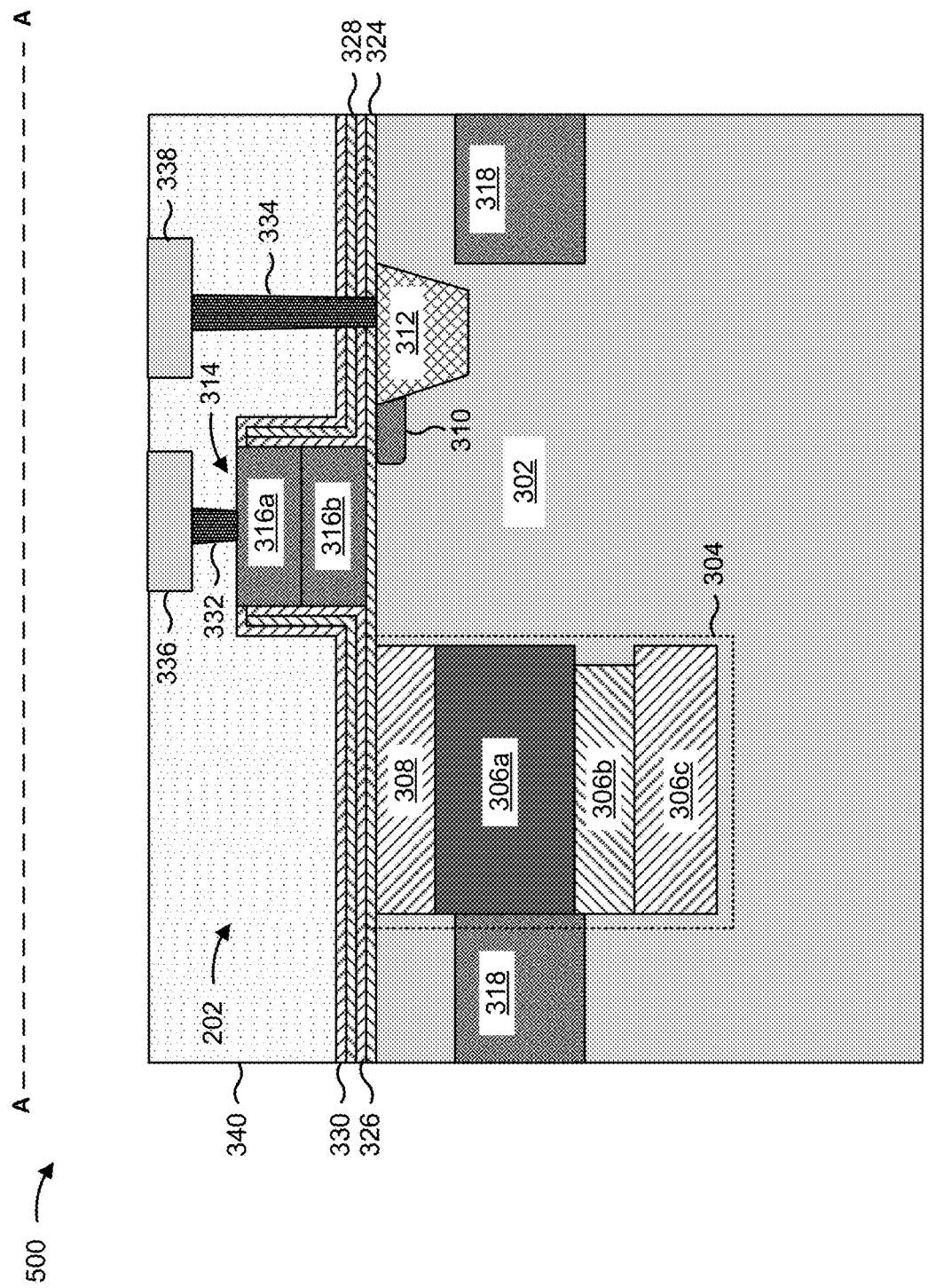

As shown in FIG. 5D,

As shown in FIG. 5E, the interconnects 332 and 334 may be formed (e.g., in a dielectric layer or an IMD layer above the substrate 302). The interconnect 332 may be formed such that the interconnect 332 is electrically connected with and/or contacts the transfer gate 314 (e.g., the n-doped upper transfer gate electrode region 316a of the transfer gate 314). The interconnect 334 may be formed such that the interconnect 334 is electrically connected with and/or contacts the drain region 312. The deposition tool 102 may deposit the material of the interconnects 332 and 334 using a CVD technique, a PVD technique, an ALD technique, or another type of deposition technique, the plating tool 112 may deposit the material of the interconnects 332 and 334 using an electroplating operation, or a combination thereof. The planarization tool 110 may planarize the interconnects 332 and 334 after the interconnects 332 and 334 are deposited.

Figure 7A:
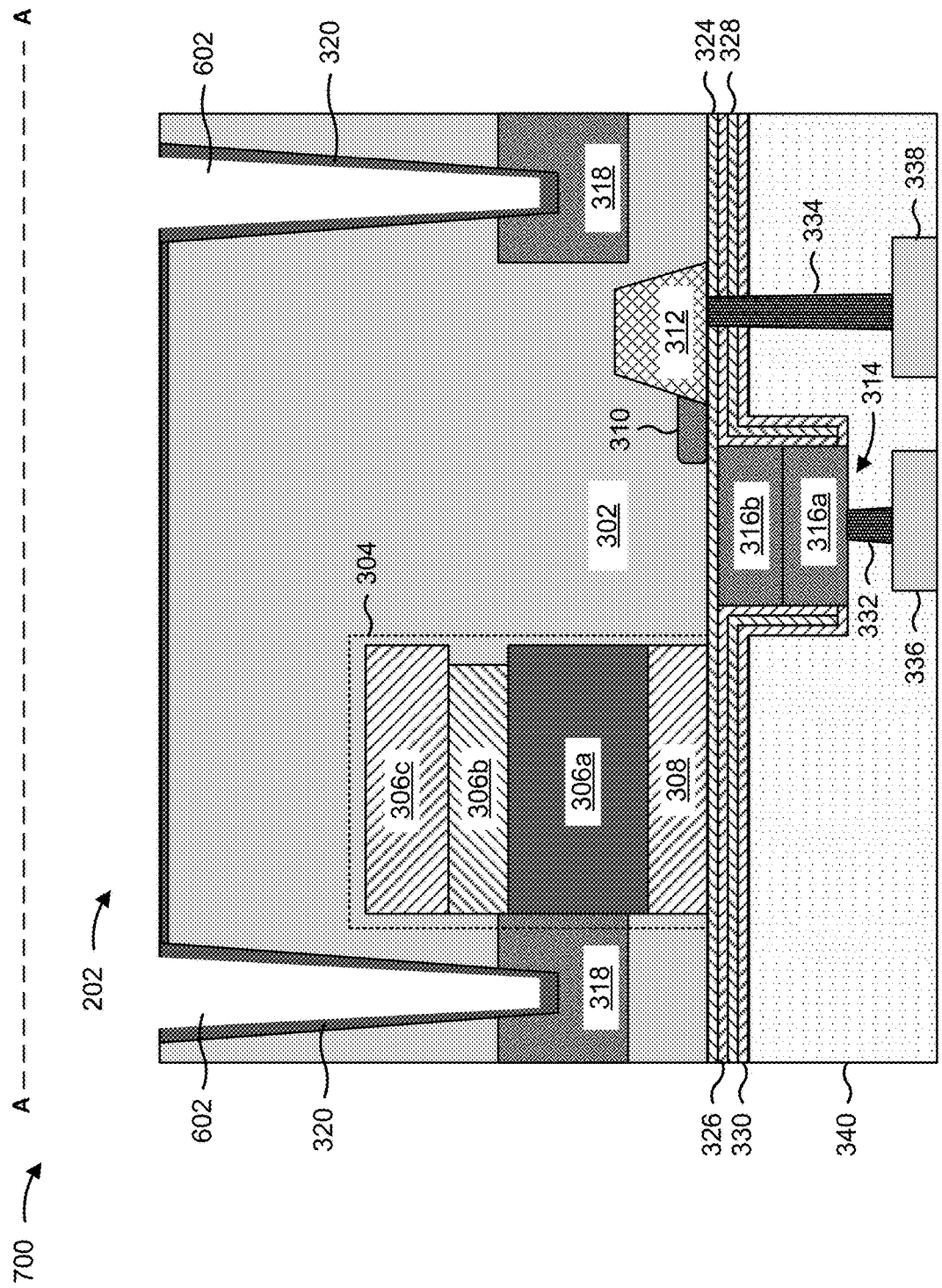
Figure 7C:
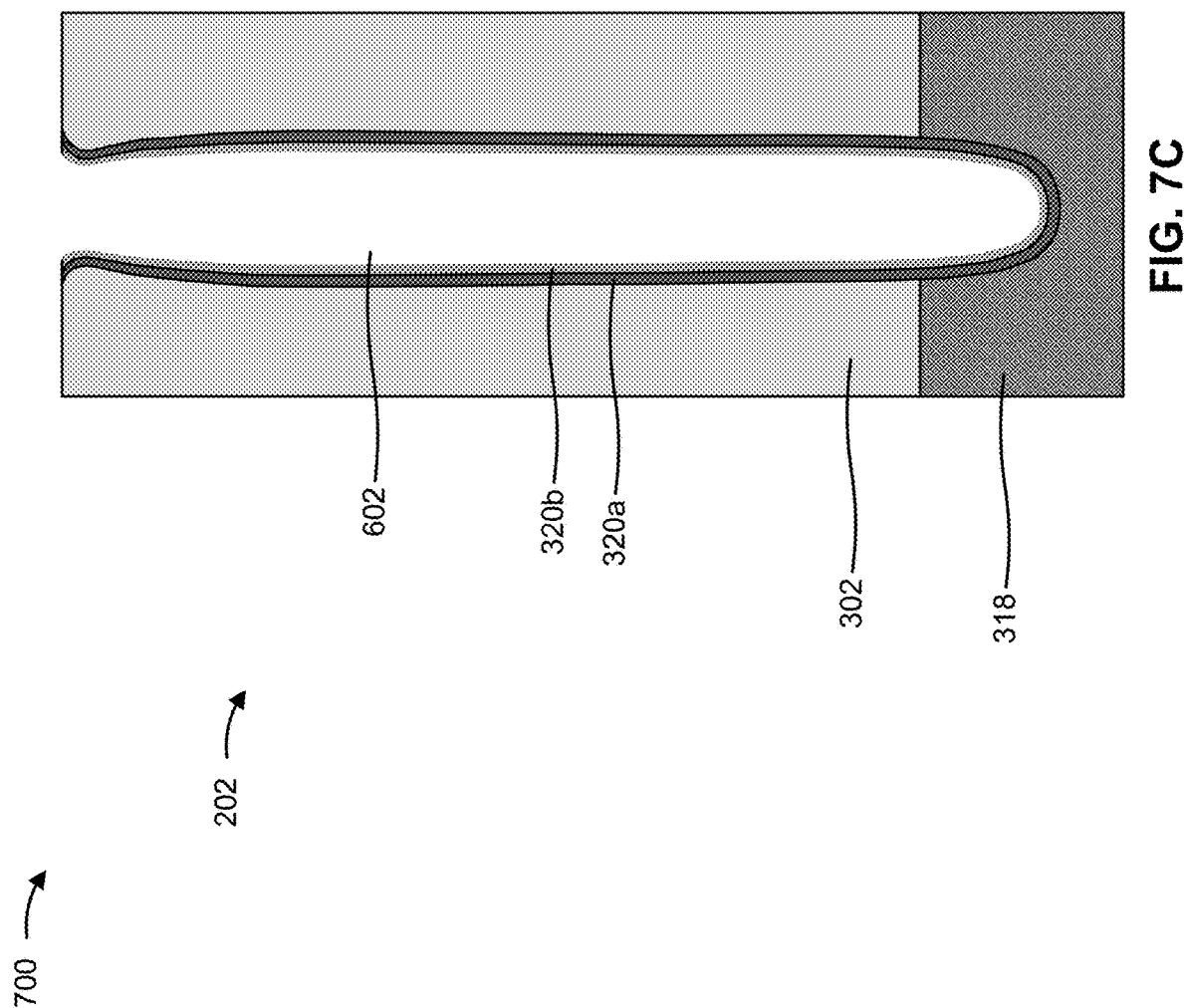
Figure 7D:
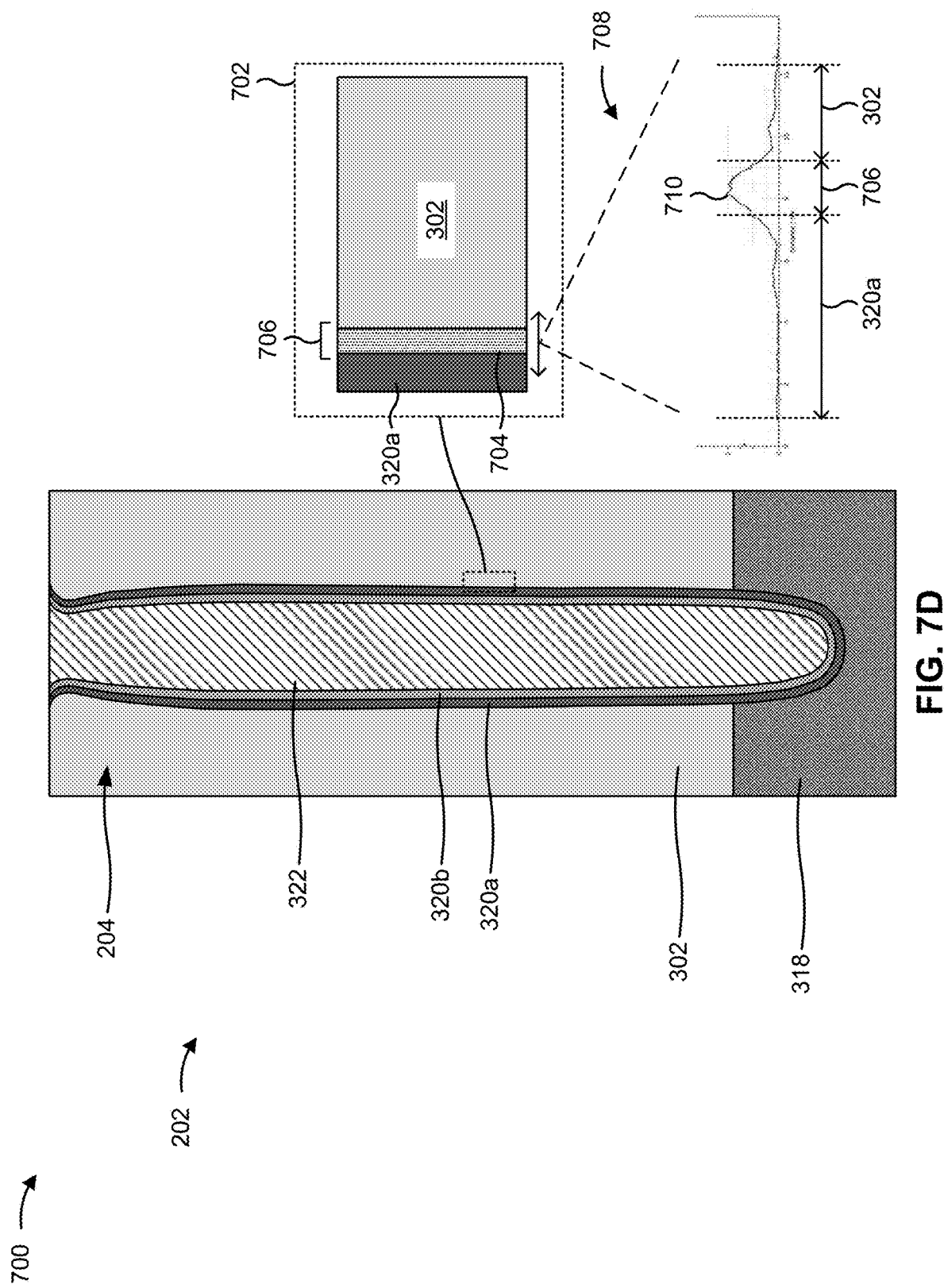
Figure 7E:
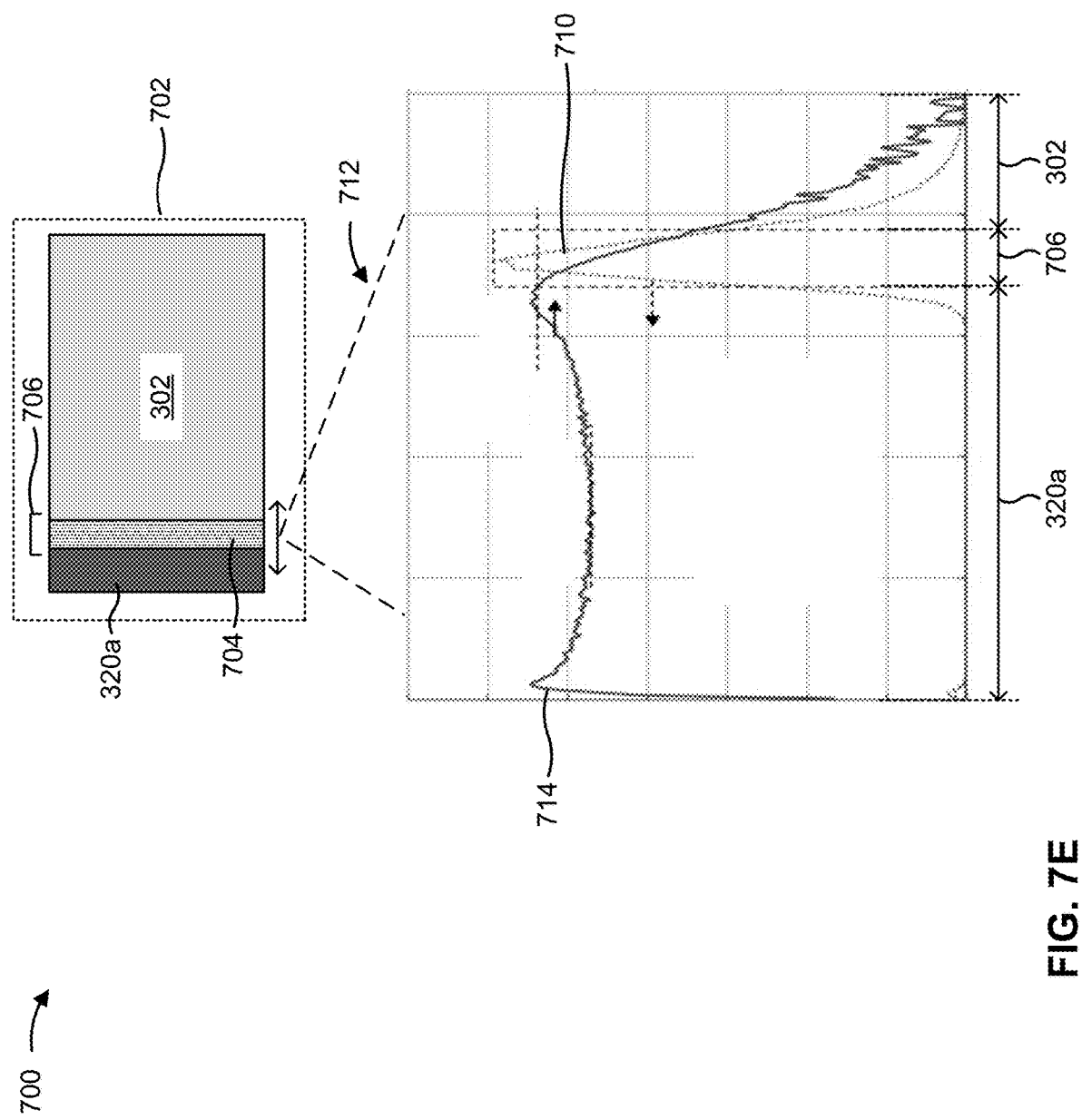

As shown in FIG. 7E, the metallization layers 336 and 338 may be formed (e.g., over and/or on a dielectric layer or an IMD layer). In particular, the metallization layer 336 may be electrically connected to the transfer gate 314 by the interconnect 332, and the metallization layer 338 may be electrically connected to the drain region 312 by the interconnect 334. The deposition tool 102 may deposit the material of the metallization layers 336 and 338 using a CVD technique, a PVD technique, an ALD technique, or another type of deposition technique, the plating tool 112 may deposit the material of the metallization layers 336 and 338 using an electroplating operation, or a combination thereof. The planarization tool 110 may planarize the metallization layers 336 and 338 after the metallization layers 336 and 338 are deposited.

As indicated above, FIGS. 7A-7E are provided as an example. Other examples may differ from what is described with regard to FIGS. 7A-7E.

FIGS. 6A-6G are diagrams of an example implementation 500 described herein. Example implementation 500 may be an example process for forming a portion of a pixel sensor 202 described herein, such as the pixel sensor 202 described in connection with FIGS. 3A and/or 3B. In particular, the example implementation 500 may be an example pre-cleaning operation for cleaning the surfaces of the sidewalls and the bottom of a recess in which the DTI structure 204 is to be formed. One or more of FIGS. 6A-6G are illustrated along the cross-section A-A of the pixel array 200 in FIG. 2. In some implementations, the operations described in connection with FIGS. 6A-6G may be performed after the operations described in connection with FIGS. 4A-4E and/or after the operations described in connection with FIGS. 5A-5G, among other examples.

As shown in FIG. 46A, the substrate 302 above the deep p-well region 318 may be etched to form a recess 602 (e.g., a trench or another type of recess) in the substrate 302. The recess 602 may be formed such that the recess 602 surrounds the one or more n-type regions 306, the p-type region 308, the drain extension region 310, the drain region 312, and the transfer gate 314. In some implementations, the recess 602 is formed such that the recess 602 partially extends into the deep p-well region 318. The recess 602 may be formed as a part of backside processing of the pixel sensor 302. Accordingly, the recess 602 may be formed from the backside surface of the substrate 302. In other words, the recess 602 may be etched into the substrate 302 from the backside surface of the substrate 302.

The deposition tool 102 may form a photoresist layer on the substrate 302, the exposure tool 104 may expose the photoresist layer to a radiation source to pattern the photoresist layer, the developer tool 106 may develop and remove portions of the photoresist layer to expose the pattern, and the etch tool 108 may etch portions of the substrate 302 (and, in some cases, portions of the deep p-well region 318) to form the recess 602. In some implementations, a photoresist removal tool removes the remaining portions of the photoresist layer (e.g., using a chemical stripper, a plasma asher, and/or another technique) after the etch tool 108 etches the substrate 302 (and, in some cases, the deep p-well region 318) to form the recess 602.

Figure 6A:
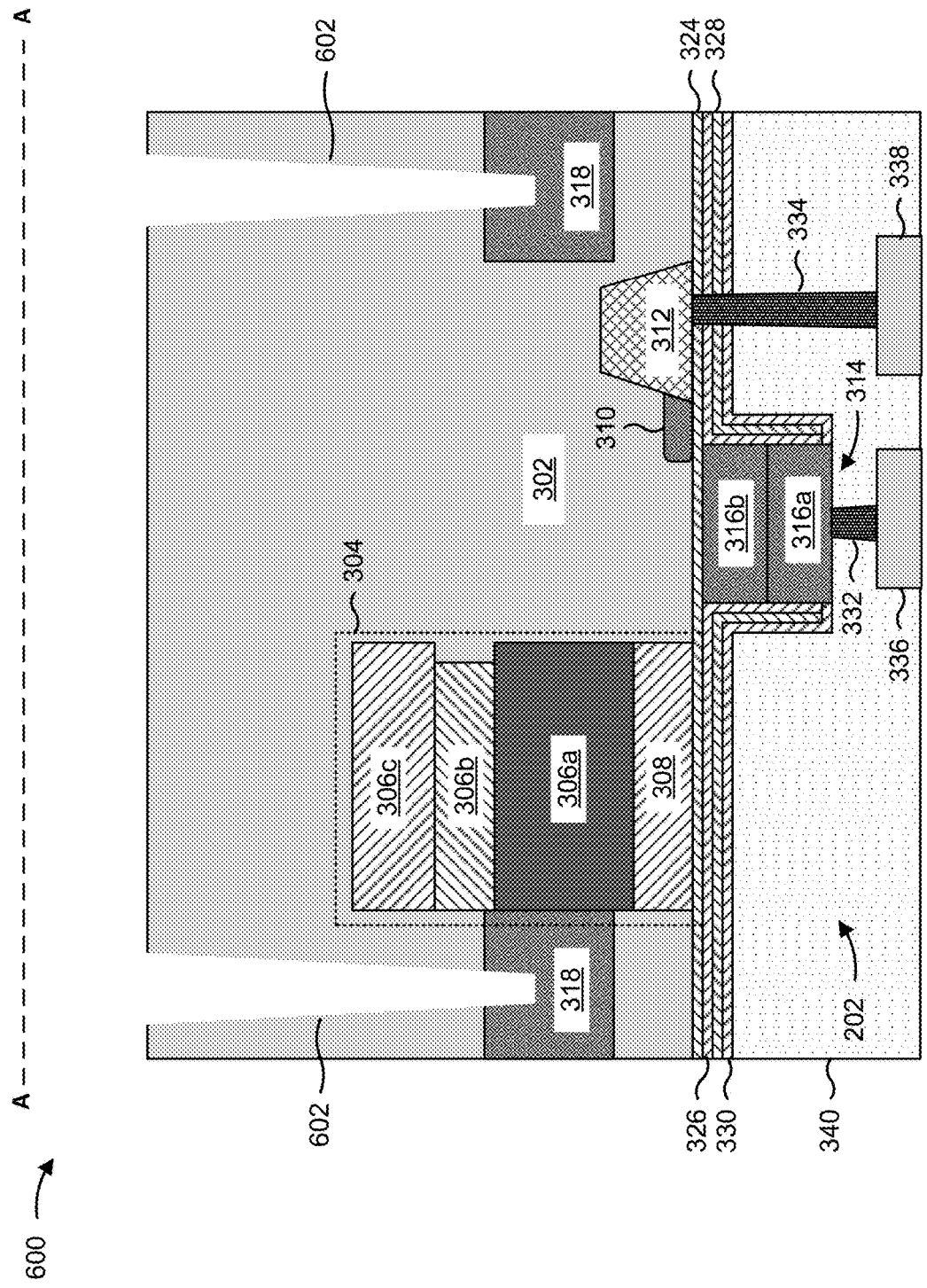
Figure 6B:
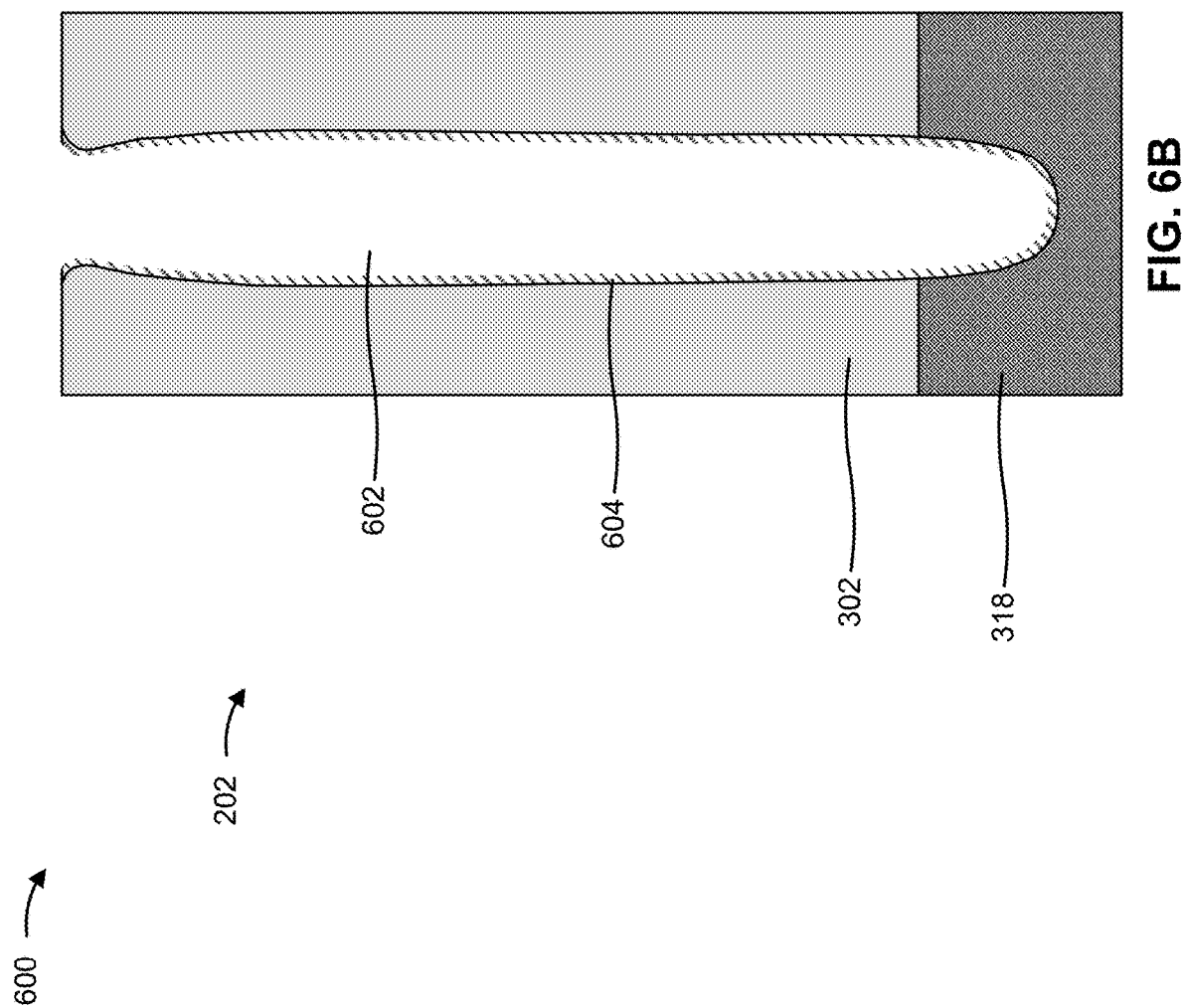

As shown in FIG. 6B, an oxide layer 604 may form on the surfaces of the sidewalls and the bottom of the recess 602. The oxide layer 604 may include an oxide of a material of the substrate 302. As an example, if the substrate 302 includes silicon (Si), the oxide layer 604 may include a silicon oxide ($SiO_x$). In some implementations, the thickness of the oxide layer 604 is included in a range of approximately 0.3 nanometers to approximately 0.5 nanometers. However, other values for the range are within the scope of the present disclosure. In some implementations, an oxygen concentration in the oxide layer 604 is included in a range of approximately $3 \times 10^{19}$ atoms per cubic centimeter to approximately $1.1 \times 10^{20}$ atoms per cubic centimeter. However, other values for the range are within the scope of the present disclosure.

The oxide layer 604 includes a surface portion of the substrate 302 in the recess 602 where atmospheric oxygen diffuses into the substrate 302. The oxide layer 604 may be referred to as a native oxide layer or a residual oxide layer in that the oxide layer 604 naturally forms due to oxidation of the surfaces of the recess 602. Oxidation may occur as a result of atmospheric oxygen readily bonding with the surfaces of the recess 602. Oxidation may occur during transportation of the pixel array 200 between processing chambers, while the pixel array 200 is being stored, while the pixel array 200 is queued for processing (which may be for multiple hours or longer), and/or during another time when the pixel array 200 is exposed to oxygen.

As shown in FIG. 6C, a deposition operation may be performed to form a germanium (Ge) layer 606 on the oxide layer 604 in the recess 602. In particular, the germanium layer 606 may be formed on the oxide layer 604 that is on the sidewalls and on the bottom of the recess 602. In some implementations, the germanium layer 606 is also formed on a top (or bottom) surface of the substrate 302 and anywhere else on which that the passivation layer 320a is to be formed.

The deposition tool 102 may deposit the germanium layer 606 using a CVD technique, a PVD technique, an ALD technique, or another type of deposition technique. In some implementations, the deposition tool 102 deposits the germanium layer 606 by flowing in a germanium precursor into a processing chamber of the deposition tool 102. The germanium precursor may include a germanium hydride (e.g., $GeH_x$ such as $GeH_4$) or another germanium precursor. In some implementations, a carrier gas such as hydrogen ($H_2$) is used to flow in the germanium precursor into the processing chamber. In some implementations, the germanium layer 606 is formed to a thickness that is included in a range of approximately 1 nanometer to approximately 3 nanometers to provide a sufficient amount of germanium atoms for oxygen removal from the surfaces of the recess 602. However, other values for the range are within the scope of the present disclosure.

In some implementations, the deposition tool 102 deposits the germanium layer 606 at a temperature that is included in a range of approximately 380 degrees Celsius to approximately 410 degrees Celsius. Depositing the germanium layer 606 at a temperature that is approximately 380 degrees Celsius or greater may facilitate a reaction between the germanium precursor and the silicon oxide in the oxide layer 604 to enable the deposition tool 102 to achieve a sufficiently high deposition rate for the germanium layer 606. Depositing the germanium layer 606 at a temperature that is approximately 410 degrees Celsius or less reduces the likelihood of damage to the other structures and devices of the pixel array 200. However, other values for the range are within the scope of the present disclosure.

In some implementations, the deposition tool 102 deposits the germanium layer 606 at a pressure that is included in a range of approximately 10 torr to approximately 40 torr to achieve a sufficiently high growth rate for the germanium layer 606. However, other values for the range are within the scope of the present disclosure. In some implementations, the time duration of deposition of the germanium layer 606 is included in a range of approximately 10 seconds to approximately 30 seconds to achieve a sufficient thickness for the germanium layer 606. However, other values for the range are within the scope of the present disclosure.

As described herein, a deposition tool 102 and an etch tool 108 may be included in a same semiconductor processing tool in deposition and etch operations are performed in the same processing chamber. Accordingly, the processing chamber may be purged with a process gas such as hydrogen (H$_2$) during a stabilization duration after the deposition operation. The time duration of the stabilization duration may be included in a range of approximately 3 seconds to approximately 5 seconds to permit the processing chamber to be purged and to permit the oxide layer 604 and the germanium layer 606 to interact.

Figure 6D:
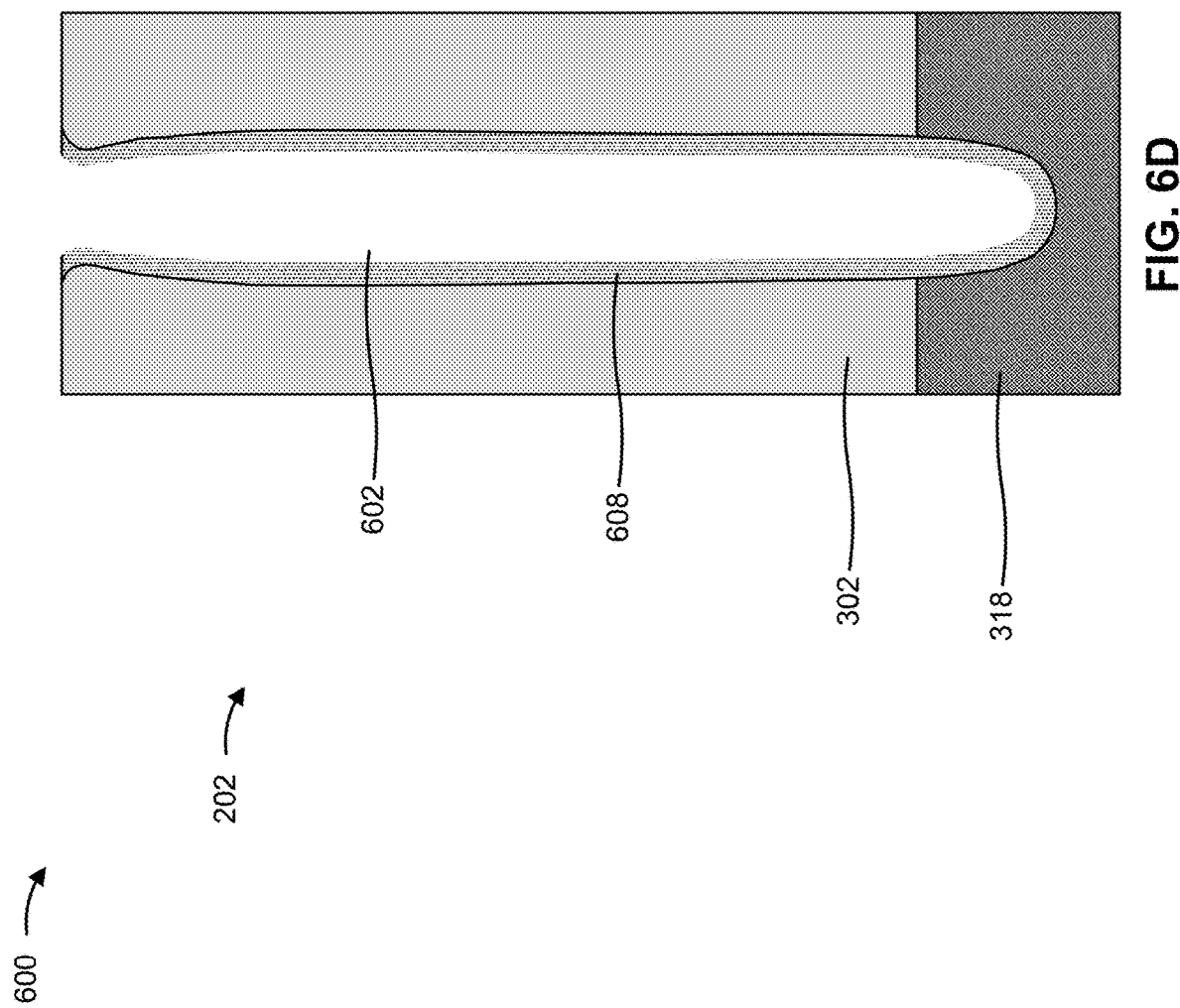

As shown in FIG. 6D, a byproduct layer 608 may form as the silicon oxide in the oxide layer 604 and the germanium hydride in the germanium layer 606 interact during the stabilization duration that occurs after deposition of the germanium layer 606. The byproduct layer 608 may include a monolayer or another type of layer. A monolayer may refer to a layer having a single molecule thickness.

The silicon in the oxide layer 604 and the germanium in the germanium layer 606 may interact to form silicon germanium (SiGe) in the byproduct layer 608. The oxygen in the oxide layer 604 and the germanium in the germanium layer 606 readily bond to form a germanium oxide (GeO$_x$ such as germanium monoxide (GeO)) in the byproduct layer 608. The germanium oxide is a volatile compound that is removed from the byproduct layer 608 by volatile evaporation. The surface reaction of the germanium of the germanium layer 606 and the oxygen of the oxide layer 604 may include:

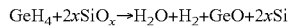

$$GeH_4 + 2xSiO_x \rightarrow H_2O + H_2 + GeO + 2xSi$$

where the germanium hydride that is used to form the germanium layer 606 and the silicon oxide in the oxide layer 604 react to form water vapor, hydrogen gas, and germanium oxide. The remaining silicon bonds with the germanium to form the silicon germanium of the byproduct layer 608.

As shown in FIG. 6E, the byproduct layer 608 is removed from the surfaces of the sidewalls and the bottom of the recess 602 after the stabilization duration. The etch tool 108 may perform an etch operation to remove the byproduct layer 608. In some implementations, the etch tool 108 also removes surface carbon contamination from the recess 602.

In some implementations, the etch tool 108 removes the entire byproduct layer 608 during the etch operation. In some implementations, the etch tool 108 removes the byproduct layer 608 and etches into a portion of the substrate 302 in the recess 602 in the etch operation. In some implementations, the etch tool 108 removes a portion of the byproduct layer 608 (e.g., to prevent further etching to the substrate 302 in the recess 602). In these implementations, the etch tool 108 may remove approximately 0.8 nanometers of thickness of the byproduct layer 608 to approximately 1 nanometer of thickness of the byproduct layer 608 to remove a sufficient amount of oxygen while minimizing removal of the substrate 302. However, other values for the range are within the scope of the present disclosure.

The etch operation may include a wet etch operation, a dry etch operation, a plasma-based etch operation, and/or another type of etch operation. The etch operation may be performed in the same processing chamber as the deposition operation to deposit the germanium layer 606. Moreover, the deposition operation, the stabilization period, and the etch operation may all occur "in-situ," meaning that the deposition operation, the stabilization period, and the etch operation may all occur without breaking the vacuum in the processing chamber. This reduces the likelihood of contamination of the surfaces of the sidewalls and the bottom of the recess 602.

The etch tool 108 may use an etchant such as hydrochloric acid (HCl) and/or another etchant to remove the byproduct layer 608. The reaction between the etchant and the silicon germanium of the byproduct layer 608 may include a dissociative adsorption of the germanium in the byproduct layer 608 with chorine in the hydrochloric acid to form a germanium chloride (GeCl$_x$ such as GeCl$_2$) byproduct and a hydrogen (H$_2$) byproduct that are removed from the processing chamber. The silicon in the silicon germanium of the byproduct layer 608 is also removed by reaction with the chlorine in the hydrochloric acid, which results in the formation of a silicon chloride (SiCl$_x$ such as SiCl$_2$) by re-combinative desorption.

In some implementations, the etch tool 108 etches the byproduct layer 608 at a temperature that is included in a range of approximately 380 degrees Celsius to approximately 410 degrees Celsius. Etching the byproduct layer 608 at a temperature that is approximately 380 degrees Celsius or greater may facilitate a reaction between the silicon germanium in the byproduct layer 608 and the etchant to achieve a sufficiently high etch rate for the byproduct layer 608. Etching the byproduct layer 608 at a temperature that is approximately 410 degrees Celsius or less reduces the likelihood of damage to the other structures and devices of the pixel array 200. However, other values for the range are within the scope of the present disclosure.

In some implementations, the etch tool 108 etches the byproduct layer 608 at a pressure that is included in a range of approximately 10 torr to approximately 40 torr to achieve a sufficiently high etch rate for the byproduct layer 608. However, other values for the range are within the scope of the present disclosure. In some implementations, the time duration for etching the byproduct layer 608 is included in a range of approximately 5 seconds to approximately 15 seconds to remove a sufficient amount of the byproduct layer 608. However, other values for the range are within the scope of the present disclosure.

In some implementations, the temperature at which the germanium layer 606 is deposited, and the temperature at which the byproduct layer 608 is removed, are the same temperature. In some implementations, the temperature at which the germanium layer 606 is deposited, and the temperature at which the byproduct layer 608 is removed, are different temperatures to enable the temperatures to be optimized for the respective operations. In some implementations, the pressure at which the germanium layer 606 is deposited, and the pressure at which the byproduct layer 608 is removed, are the same pressure. In some implementations, the pressure at which the germanium layer 606 is deposited, and the pressure at which the byproduct layer 608 is removed, are different pressures to enable the pressures to be optimized for the respective operations.

Figure 6F:
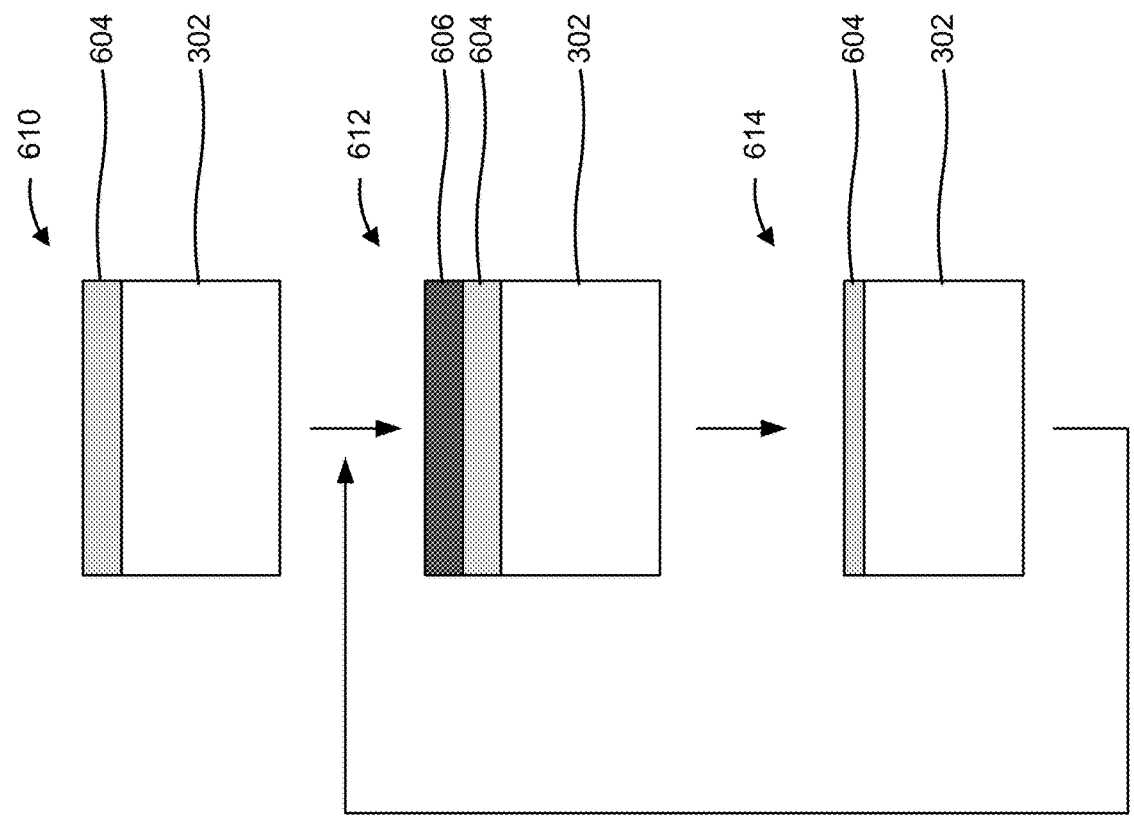

As shown in FIG. 6F, the deposition tool 102 and the etch tool 108 may use a cyclic pre-cleaning technique to remove the oxide layer 604 from the recess 602. The cyclic pre-cleaning technique may include performing a plurality of deposition and etch cycles to absorb or remove the oxide layer 604. The cyclic pre-cleaning technique permits the oxide layer 604 to be removed effectively at a relatively low temperature, which reduces the likelihood of damage to other layers and/or structures of the pixel array 200.

At 610 in FIG. 6F, the oxide layer 604 is located on the sidewalls and the bottom of the recess 602. As 612 in FIG. 6F, the deposition operation of FIG. 6C is performed to deposit the germanium layer 606. During the stabilization duration that is after the deposition operation, the byproduct layer 608 is formed and germanium oxide is removed by volatile evaporation. At 614 in FIG. 6F, the etch operation of FIG. 6E is performed to remove the byproduct layer 608. Additional deposition and etch cycles of 610-614 may be performed until a sufficient amount of the oxide layer 604 is removed. In some implementations, a plurality of deposition and etch cycles of the operations of 610-614 are performed until all of the oxide layer 604 is removed from the recess 602. In some implementations, the quantity of deposition and etch cycles that are performed may be included in a range of approximately 10 cycles to approximately 30 cycles to achieve sufficient oxygen removal while reducing the likelihood of etching into the substrate 302 in the recess 602. However, other values for the range are within the scope of the present disclosure.

Figure 6G:
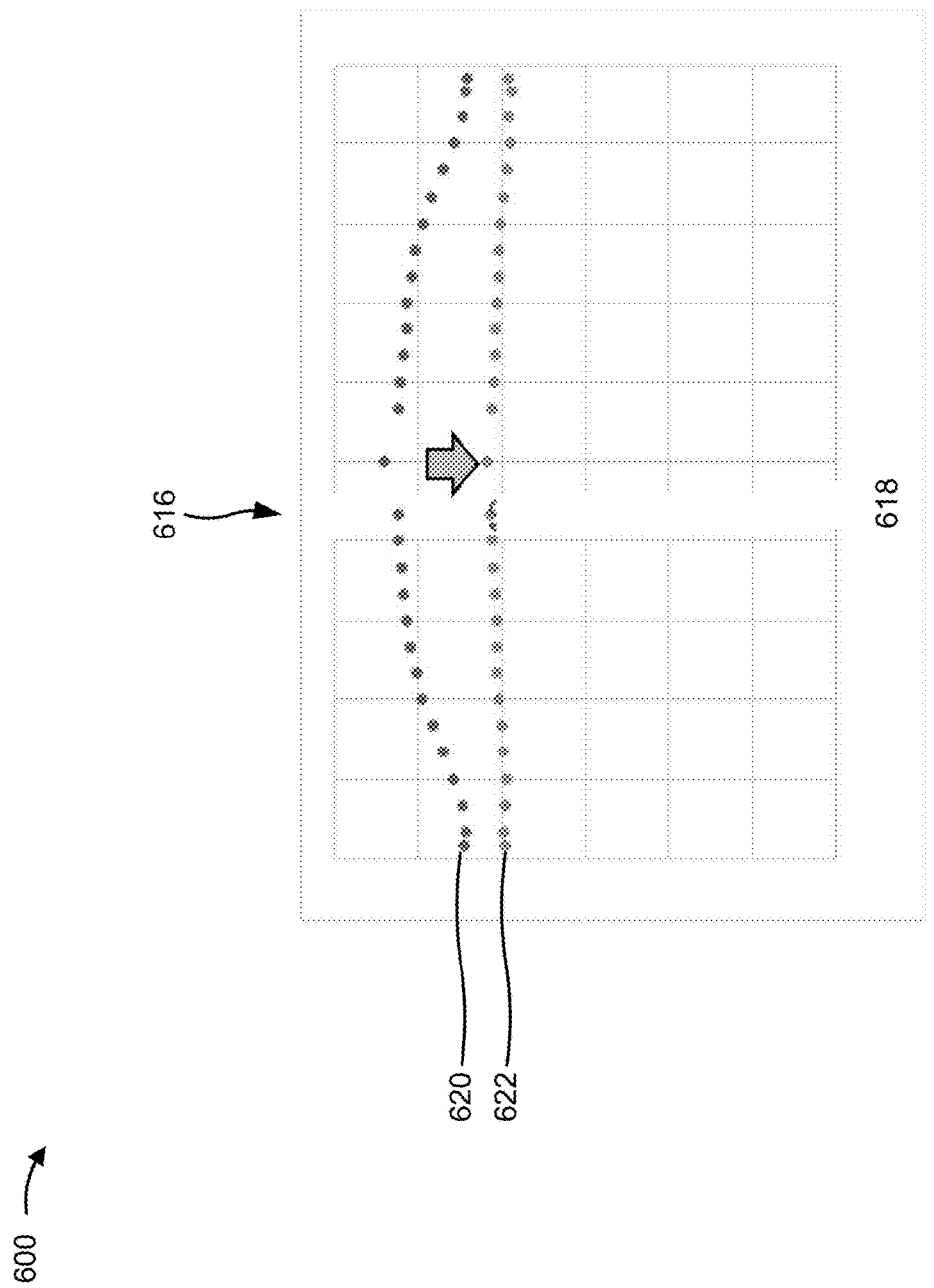

FIG. 6G illustrates an example data plot of the thickness 616 of the oxide layer 604 along a radius 618 of the oxide layer 604. A dataset 620 in FIG. 6G represents the thickness 616 along the radius 618 prior to a deposition and etch cycle described above, and a dataset 622 in FIG. 6G represents the thickness 616 along the radius 618 after the deposition and etch cycle. As shown in FIG. 6G, the deposition and etch cycle reduces the thickness 616 of the oxide layer 604 (which results in removal of oxygen).

As indicated above, FIGS. 6A-6G are provided as example. Other examples may differ from what is described with regard to FIGS. 6A-6G.

FIGS. 7A-7G are diagrams of an example implementation 700 described herein. Example implementation 700 may be an example process for forming a portion of a pixel sensor 202 described herein, such as the pixel sensor 202 described in connection with FIGS. 3A and/or 3B. One or more of FIGS. 7A-7G are illustrated along the cross-section A-A of the pixel array 200 in FIG. 2. In some implementations, the operations described in connection with FIGS. 7A-7G may be performed after the operations described in connection with FIGS. 4A-4E, after the operations described in connection with FIGS. 5A-5G, and/or after the operation described in connection with FIGS. 6A-6G, among other examples.

As shown in FIG. 7A, the recess 602 may be lined with one or more layers 320. The deposition tool 102 may form the one or more layers 320 by conformal deposition such that the one or more layers 320 are formed as thin films that conform to the shape and/or profile of the sidewalls and bottom surface of the recess 602.

FIGS. 7B and 7C illustrate details of forming the one or more layers 320. As shown in FIG. 7B, the deposition tool 102 may conformally deposit the passivation layer 320a (e.g., a boron layer such as a Si:B epitaxy layer or an amorphous boron layer) on sidewalls of the recess 602 and on a bottom surface of the recess 602 such that the passivation layer 320a lines the recess 602. In some implementations, the passivation layer 320a (e.g., an amorphous boron layer) and/or the capping layer 320b are formed on a backside surface of the substrate 302 within a perimeter of the recess 602. In some implementations, a boron precursor is used to deposit the passivation layer 320a. For example, the deposition tool 102 may use a boron precursor such as diborane ($B_2H_6$) and/or another boron precursor to deposit the passivation layer 320a. In some implementations, the deposition tool 102 may form the passivation layer 320a to a thickness that is in a range of approximately 1 nanometer to approximately 3 nanometers to enable formation of a continuous film for the passivation layer 320a with a sufficiently low surface roughness and to provide a sufficient amount of negative charge for formation of the depletion region in the substrate 302. However, other values for the range are within the scope of the present disclosure.

The passivation layer 320a may be deposited at a low temperature to minimize and/or prevent formation of boron silicide ($B_xSi_y$) from the boron of the passivation layer 320a and the silicon of the substrate 302, and to promote and/or facilitate formation of a boron-silicon interface on the sidewalls and the bottom surface of the recess 602. For example, the deposition tool 102 may form the passivation layer 320a at a temperature that is in a range of approximately 250 degrees Celsius to approximately 450 degrees Celsius. Forming the passivation layer 320a in this example temperature range may provide a sufficient growth rate for the passivation layer 320a and a sufficient absorption coefficient for the passivation layer 320a, while minimizing the likelihood of formation of boron silicide ($B_xSi_y$), and minimizing the likelihood of damage to other layers and/or structures of the pixel sensor 202. However, other values for the range are within the scope of the present disclosure.

In some implementations, the deposition tool 102 uses an LPCVD technique to form the passivation layer 320a. For example, the deposition tool 102 may form the passivation layer 320a at a pressure that is in a range of approximately 10 torr to approximately 500 torr. Forming the passivation layer 320a in this example pressure range may provide a sufficient growth rate for the passivation layer 320a and a sufficient absorption coefficient for the passivation layer 320a, while achieving high film uniformity for the passivation layer 320a. However, other values for the range are within the scope of the present disclosure.

In some implementations, the annealing tool 116 may perform an annealing operation on the passivation layer 320a after the deposition tool 102 forms the passivation layer 320a. In some implementations, the annealing tool 116 and the deposition tool 102 perform a plurality of cyclic deposition and anneal operations. In each cycle, the deposition tool 102 may deposit a portion of the passivation layer 320a and the annealing tool 116 may anneal the portion of the passivation layer 320a. A quantity of the cycles may be performed until a particular thickness for the passivation layer 320a is achieved. The annealing operation may be performed to increase the film quality of the passivation layer 320a (e.g., to remove voids and/or other defects in the passivation layer 320a, to reduce surface roughness of the passivation layer 320a, to increase film uniformity of the passivation layer 320a). The annealing operation may include a laser-based surface annealing operation and/or another type of annealing operation.

As shown in FIG. 7C, the deposition tool 102 may conformally deposit the capping layer 320b (e.g., a silicon layer such as an amorphous silicon layer) over the sidewalls of the recess 602 and over the bottom surface of the recess 602 such that the capping layer 320b is formed on the passivation layer 320a in the recess 602. In some implementations, the deposition tool 102 may form the capping layer 320b to a thickness that is in a range of approximately 1 nanometer to approximately 5 nanometers to enable formation of a continuous film for the capping layer 320b with a sufficiently low surface roughness. However, other values for the range are within the scope of the present disclosure.

The capping layer 320b may be deposited at a low temperature to minimize and/or prevent formation of boron silicide ($B_xSi_y$) from the boron of the passivation layer 320a and the silicon of the capping layer 320b. For example, the deposition tool may form the capping layer 320b at a temperature that is in a range of approximately 250 degrees Celsius to approximately 450 degrees Celsius. Forming the capping layer 320b in this example temperature range may provide a sufficient growth rate for the capping layer 320b and a sufficient absorption coefficient for the capping layer 320b, while minimizing the likelihood of formation of boron silicide ($B_xSi_y$), and minimizing the likelihood of damage to other layers and/or structures of the pixel sensor 202. However, other values for the range are within the scope of the present disclosure.

In some implementations, the deposition tool 102 uses an LPCVD technique to form the capping layer 320b. For example, the deposition tool 102 may form the capping layer 320b at a pressure that is in a range of approximately 10 torr to approximately 500 torr. Forming the capping layer 320b in this example pressure range may provide a sufficient growth rate for the capping layer 320b and a sufficient absorption coefficient for the capping layer 320b, while achieving high film uniformity for the capping layer 320b. However, other values for the range are within the scope of the present disclosure.

As shown in FIG. 7D, the recess 602 may be filled with an oxide material to form an oxide layer 322 of the DTI structure 204. The deposition tool 102 may form the oxide layer 322 over the passivation layer 320a, over the capping layer 320b, and/or on the capping layer 320b. The deposition tool 102 may deposit the oxide layer 322 using a CVD technique, a PVD technique, an ALD technique, or another type of deposition technique. The planarization tool 110 may planarize the oxide layer 322 after the oxide layer 322 is deposited in the recess 602 such that a top surface of the oxide layer 322 and a backside surface of the substrate 302 are approximately a same height.

In some implementations, a wet cleaning operation may be performed (e.g., by the deposition tool 102 and/or another type of semiconductor processing tool) after formation of the capping layer 320b and prior to formation of the oxide layer 322 in the recess 602. The wet cleaning operation may be performed to clean the recess 602 prior to filling the trench with the oxide material of the oxide layer 322 (e.g., to reduce the likelihood of defect formation in the DTI structure 204). The capping layer 320b may protect the passivation layer 320a from being damaged during the wet cleaning operation.

As further shown in a close-up view 702 in FIG. 7D, a silicon germanium (SiGe) layer 704 is located at an interface 706 between the passivation layer 320a and the substrate 302. The silicon germanium layer 704 may include residual silicon germanium of one or more byproduct layers 608 that was not removed by the cyclic pre-cleaning technique described above.

In some implementations, the thickness of the silicon germanium layer 704 is included in a range of approximately 0.5 nanometers to approximately 2 nanometers. However, other values for the range are within the scope of the present disclosure. In some implementations, the germanium concentration in the silicon germanium layer 704 is included in a range of approximately 1% germanium to approximately 3% germanium. However, other values for the range are within the scope of the present disclosure.

FIG. 7D further includes an example data plot 708 that illustrates a germanium concentration 710 through the interface 706 as a function of depth. As shown, the germanium concentration 710 through the thickness of the passivation layer 320a is relatively low and increases toward the silicon germanium layer 704. The germanium concentration 710 is greatest in the silicon germanium layer 704. The germanium concentration 710 through the thickness of the substrate 302 is relatively low and increases toward the silicon germanium layer 704.

FIG. 7E includes an example data plot 712 that illustrates a boron concentration 714 along with the germanium concentration 710 through the interface 706 as a function of depth. As shown in FIG. 7E, the boron concentration 714 is greatest in the passivation layer 320a. The boron concentration 714 decreases through the thickness of the silicon germanium layer 704 and through the thickness of the substrate 302 as a function of depth. The silicon germanium layer 704 and the substrate 302 may include a small amount of boron due to diffusion of boron into the silicon germanium layer 704 and into the substrate 302 during and/or after epitaxial growth of the passivation layer 320a.

Figure 7F:
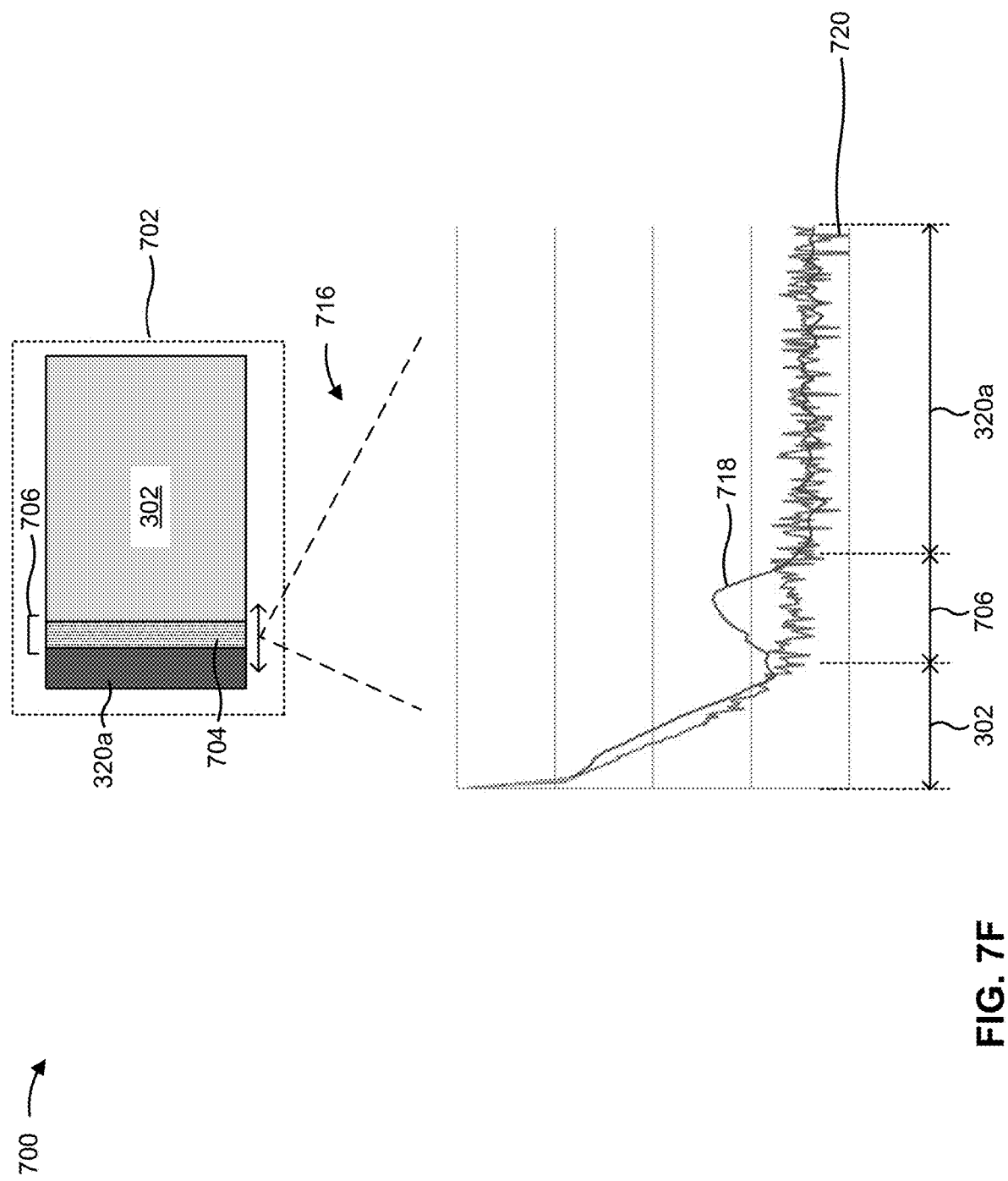

FIG. 7F includes an example data plot 716 of oxygen concentration through the interface 706 as a function of depth. The data set 718 on the data plot 716 represents the oxygen concentration through a related interface that is formed without the use of the cyclic pre-cleaning technique described herein. The data set 720 on the data plot 716 represents the oxygen concentration through the interface 706 that is formed with the use of the cyclic pre-cleaning technique described herein. As shown in FIG. 7F, the oxygen concentration through the interface 706 (as represented by the data set 720) decreases as a function of depth through the interface 706. In particular, the oxygen concentration decreases from the passivation layer 320a to the substrate 302 through the silicon germanium layer 704 as opposed to the oxygen concentration through the related interface (which increases due to residual oxides that are not removed).

Figure 7G:
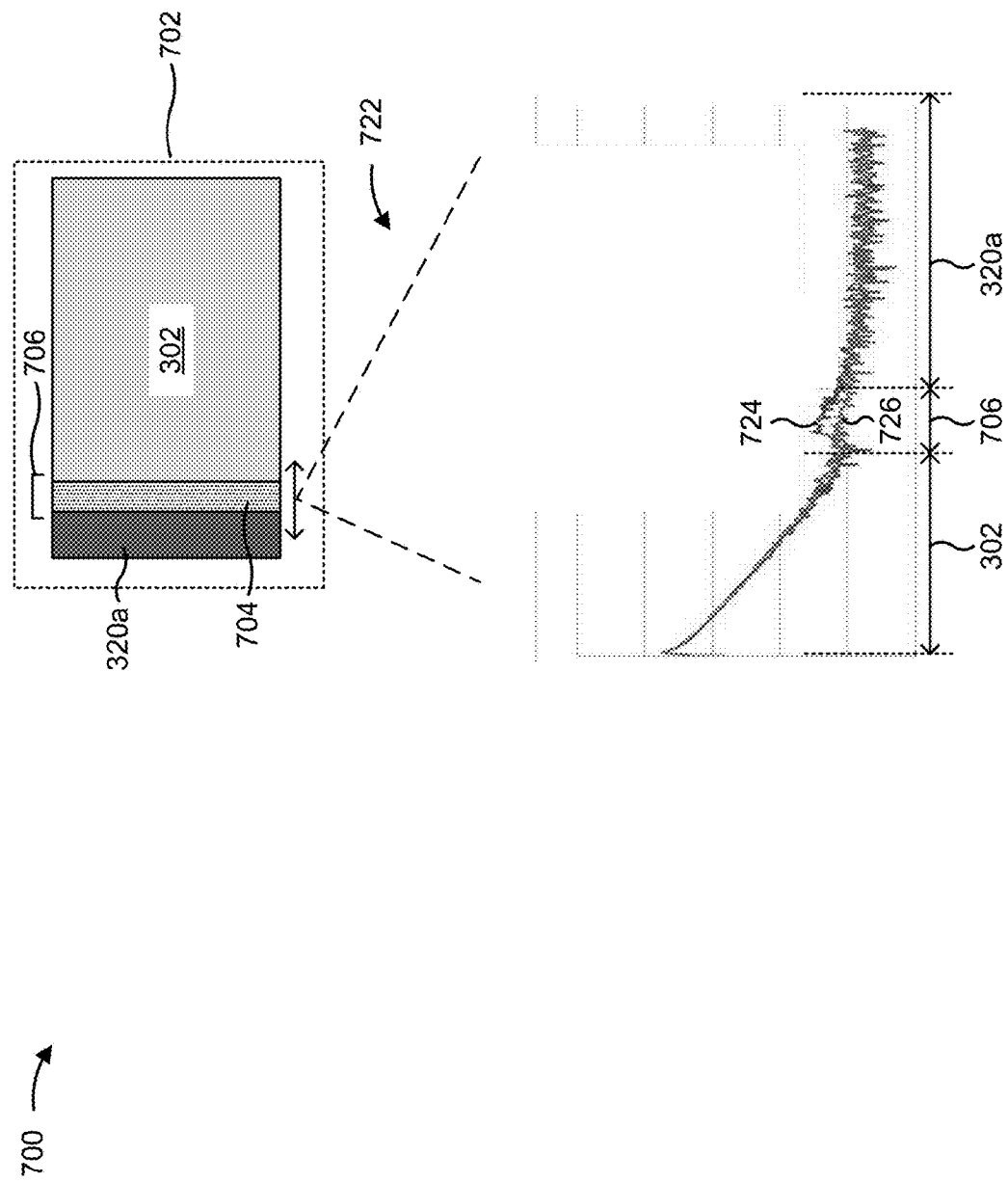

FIG. 7G includes an example data plot 722 of carbon concentration through the interface 706 as a function of depth. The data set 724 on the data plot 722 represents the carbon concentration through a related interface that is formed without the use of the cyclic pre-cleaning technique described herein. The data set 726 on the data plot 722 represents the carbon concentration through the interface 706 that is formed with the use of the cyclic pre-cleaning technique described herein. As shown in FIG. 7G, the carbon concentration through the interface 706 (as represented by the data set 726) decreases as a function of depth through the interface 706. In particular, the carbon concentration decreases from the passivation layer 320a to the substrate 302 through the silicon germanium layer 704 as opposed to the carbon concentration through the related interface (which increases due to residual surface carbon contamination that is not removed).

In some implementations, additional layers and/or structures may be formed for the pixel sensor 202. For example, a $p^+$ ion layer 342, an ARC 344, a color filter layer 346, and a micro-lens layer 348 may be formed over the frontside of the substrate 302. The deposition tool 102 may deposit the $p^+$ ion layer 342, the ARC 344, the color filter layer 346, and the micro-lens layer 348 using a CVD technique, a PVD technique, an ALD technique, or another type of deposition technique. The $p^+$ ion layer 342 may be formed over and/or on the substrate 302. The ARC 344 may be formed over and/or on the $p^+$ ion layer 342. The color filter layer 346 may be formed over and/or on the ARC 344. The micro-lens layer 348 may be formed over and/or on the color filter layer 346. In some implementations, the planarization tool 110 planarizes the $p^+$ ion layer 342, the ARC 344, and/or the color filter layer 346.

As indicated above, FIGS. 7A-7G are provided as examples. Other examples may differ from what is described with regard to FIGS. 7A-7G.

Figure 8:
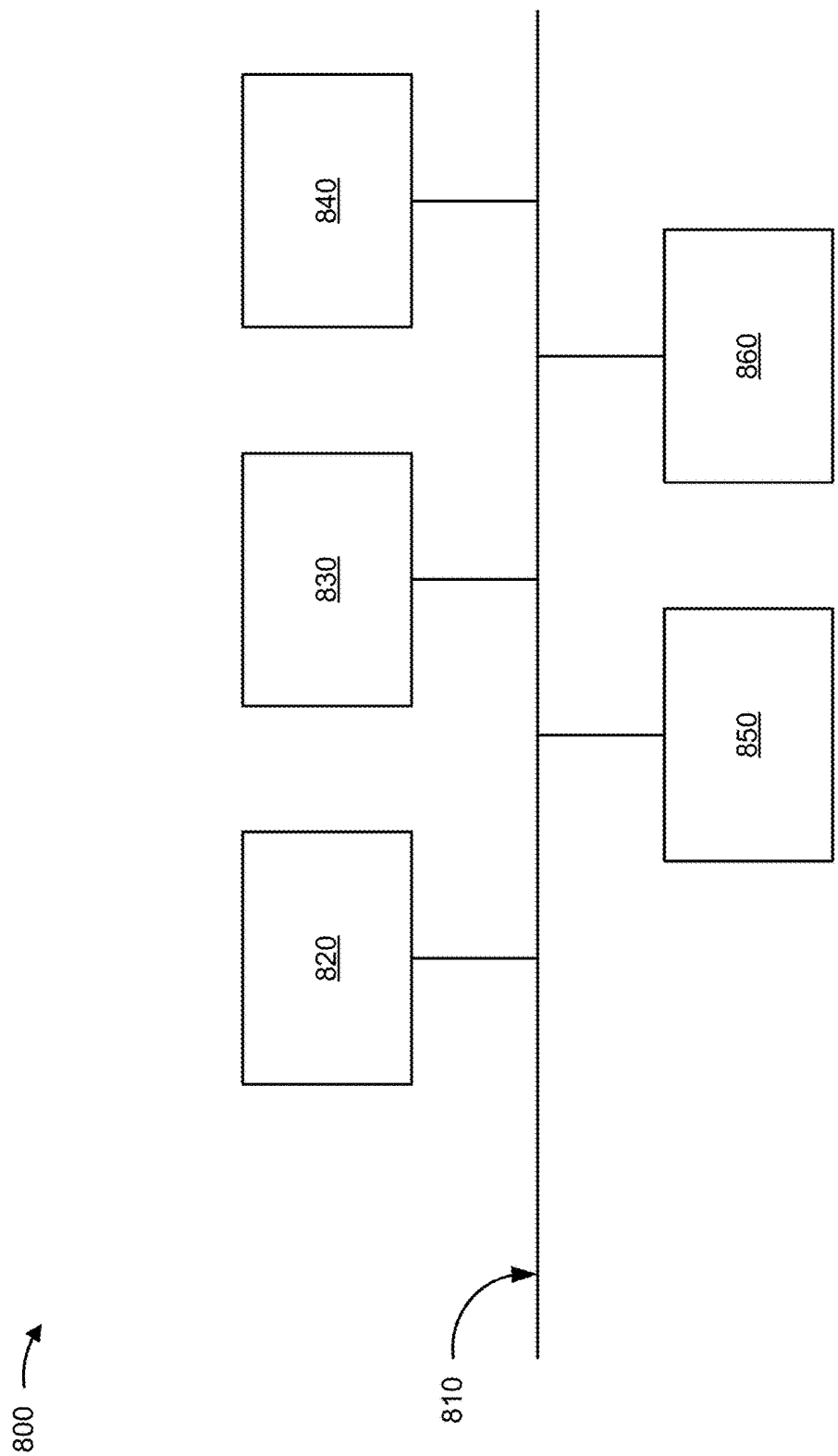
FIG. 8 is a diagram of example components of one or more devices described herein.

FIG. 8 is a diagram of example components of a device 800. In some implementations, one or more of the semiconductor processing tools 102-116 and/or the wafer/die transport tool 118 include one or more devices 800 and/or one or more components of device 800. As shown in FIG. 8, device 800 may include a bus 810, a processor 820, a memory 830, an input component 840, an output component 850, and a communication component 860.

Bus 810 includes one or more components that enable wired and/or wireless communication among the components of device 800. Bus 810 may couple together two or more components of FIG. 8, such as via operative coupling, communicative coupling, electronic coupling, and/or electric coupling. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform one or more operations or processes described elsewhere herein.

Memory 830 includes volatile and/or nonvolatile memory. For example, memory 830 may include random access memory (RAM), read only memory (ROM), a hard disk drive, and/or another type of memory (e.g., a flash memory, a magnetic memory, and/or an optical memory). Memory 830 may include internal memory (e.g., RAM, ROM, or a hard disk drive) and/or removable memory (e.g., removable via a universal serial bus connection). Memory 830 may be a non-transitory computer-readable medium. Memory 830 stores information, instructions, and/or software (e.g., one or more software applications) related to the operation of device 800. In some implementations, memory 830 includes one or more memories that are coupled to one or more processors (e.g., processor 820), such as via bus 810.

Input component 840 enables device 800 to receive input, such as user input and/or sensed input. For example, input component 840 may include a touch screen, a keyboard, a keypad, a mouse, a button, a microphone, a switch, a sensor, a global positioning system sensor, an accelerometer, a gyroscope, and/or an actuator. Output component 850 enables device 800 to provide output, such as via a display, a speaker, and/or a light-emitting diode. Communication component 860 enables device 800 to communicate with other devices via a wired connection and/or a wireless connection. For example, communication component 860 may include a receiver, a transmitter, a transceiver, a modem, a network interface card, and/or an antenna.

Device 800 may perform one or more operations or processes described herein. For example, a non-transitory computer-readable medium (e.g., memory 830) may store a set of instructions (e.g., one or more instructions or code) for execution by processor 820. Processor 820 may execute the set of instructions to perform one or more operations or processes described herein. In some implementations, execution of the set of instructions, by one or more processors 820, causes the one or more processors 820 and/or the device 800 to perform one or more operations or processes described herein. In some implementations, hardwired circuitry is used instead of or in combination with the instructions to perform one or more operations or processes described herein. Additionally, or alternatively, processor 820 may be configured to perform one or more operations or processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
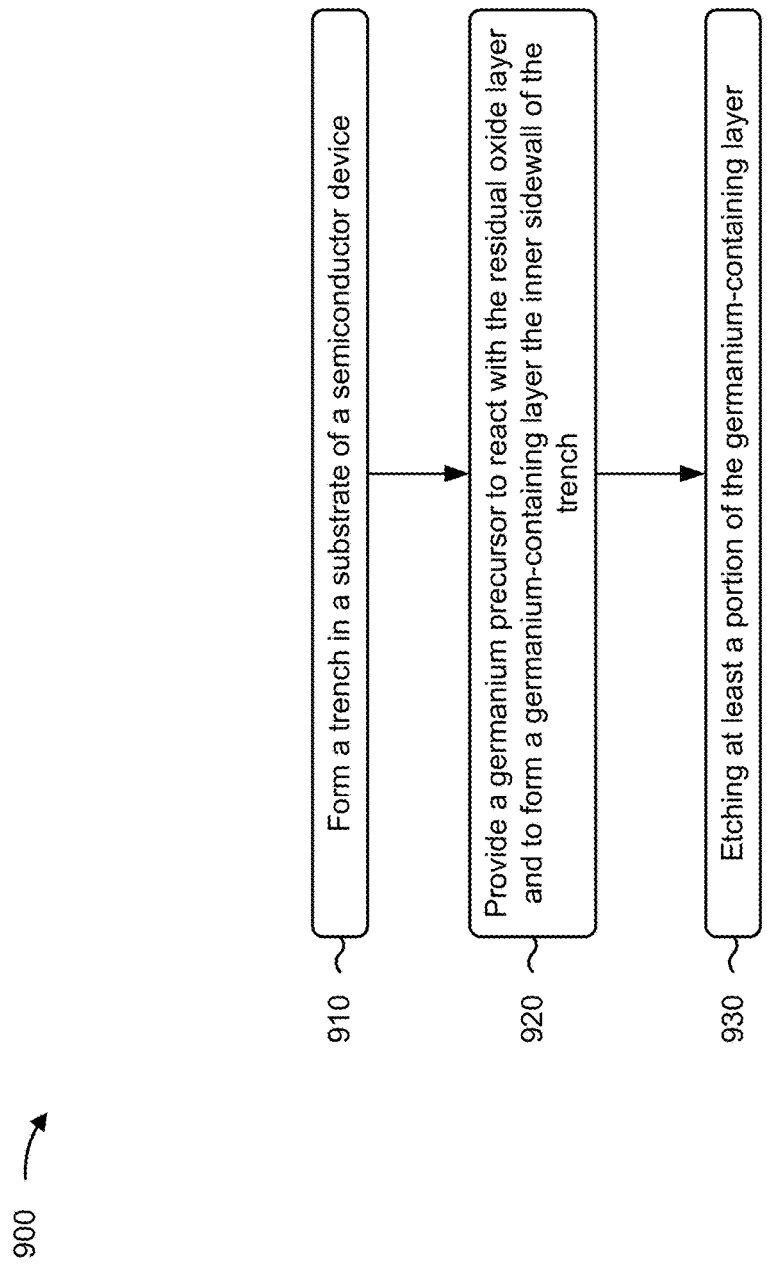
FIGS. 9 and 10 are flowcharts of example processes associated with forming a pixel sensor described herein.

FIG. 9 is a flowchart of an example process 900 associated with forming a pixel sensor described herein. In some implementations, one or more process blocks of FIG. 9 are performed by one or more semiconductor processing tools (e.g., one or more of the semiconductor processing tools 102-116). Additionally, or alternatively, one or more process blocks of FIG. 9 may be performed by one or more components of device 800, such as processor 820, memory 830, input component 840, output component 850, and/or communication component 860.

As shown in FIG. 9, process 900 may include forming a trench in a substrate of a semiconductor device (block 910). For example, one or more of the semiconductor processing tools 102-116 may form a trench (e.g., a recess 602) in a substrate 302 of a semiconductor device such as a pixel array 200, as described herein. In some implementations, the substrate 302 includes a residual oxide layer 604 of an inner sidewall of the trench.

As further shown in FIG. 9, process 900 may include providing a germanium precursor to react with the residual oxide layer and to form a germanium-containing layer over the inner sidewall of the trench (block 920). For example, one or more of the semiconductor processing tools 102-116 may provide a germanium precursor to react with the residual oxide layer and to form a germanium-containing layer over the inner sidewall of the trench, as described herein.

As further shown in FIG. 9, process 900 may include etching at least a portion of the germanium-containing layer (block 930). For example, one or more of the semiconductor processing tools 102-116 may etch at least a portion of the germanium-containing layer, as described herein.

Process 900 may include additional implementations, such as any single implementation or any combination of implementations described below and/or in connection with one or more other processes described elsewhere herein.

In a first implementation, the germanium precursor includes a germanium hydride ($GeH_x$). In a second implementation, along or in combination with the first implementation, etching at least the portion of the germanium-containing layer includes using an etchant that includes hydrochloric acid (HCl) to etch at least the portion of the germanium-containing layer. In a third implementation, along or in combination with one or more of the first or second implementations, providing the germanium precursor includes providing the germanium precursor at a temperature that is included in a range of approximately 380 degrees Celsius to approximately 410 degrees Celsius. In In a fourth implementation, alone or in combination with one or more of the first through third implementations, etching at least the portion of the germanium-containing layer includes etching at least the portion of the germanium-containing layer at a temperature that is included in the range of approximately 380 degrees Celsius to approximately 410 degrees Celsius. In a fourth implementation, alone or in combination with one or more of the first through third implementations, the temperature at which the germanium precursor is provided, and the temperature at which at least the portion of the germanium-containing layer is etched, are different temperatures.

Although FIG. 9 shows example blocks of process 900, in some implementations, process 900 includes additional blocks, fewer blocks, different blocks, or differently arranged blocks than those depicted in FIG. 9. Additionally, or alternatively, two or more of the blocks of process 900 may be performed in parallel.

Figure 10:
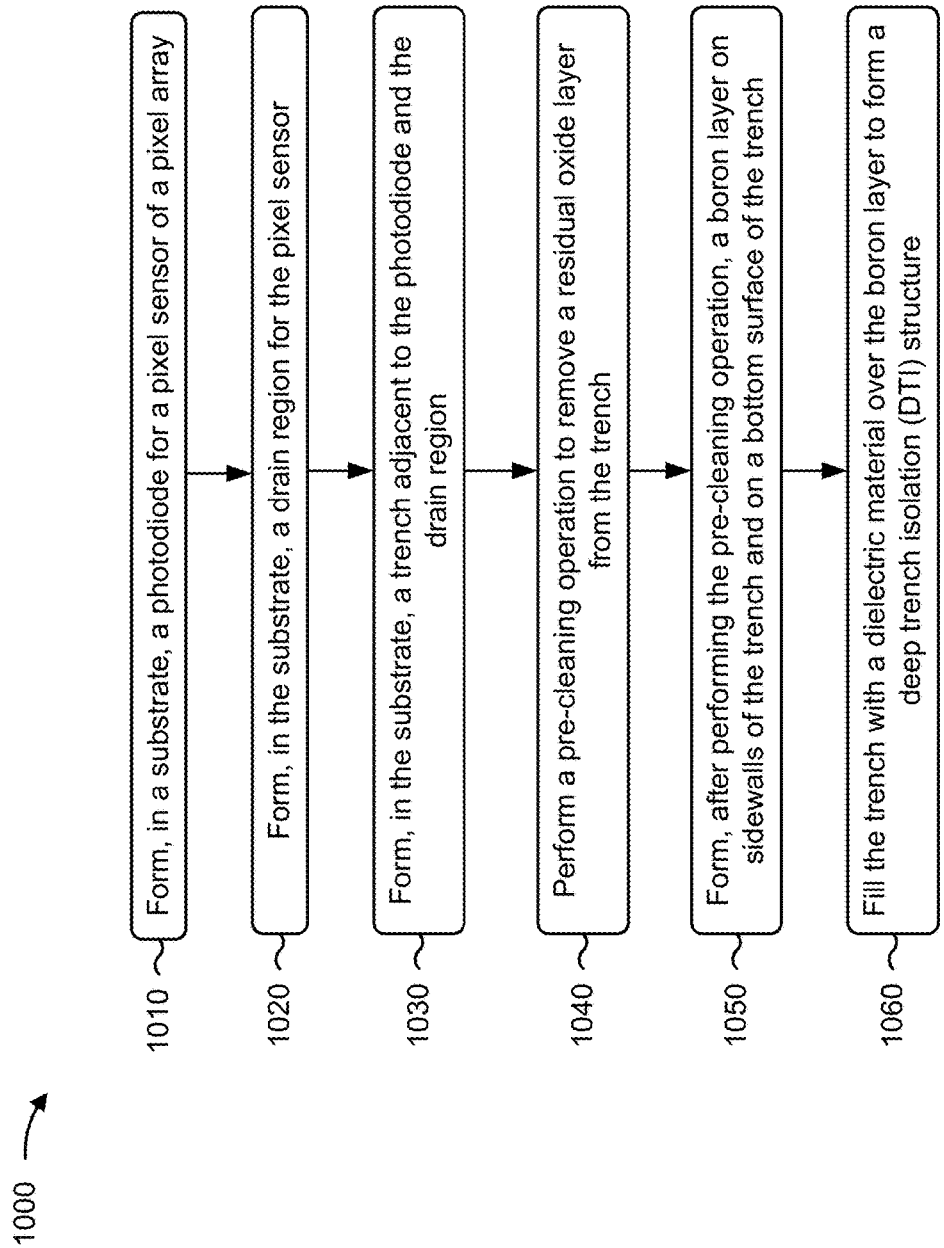

FIG. 10 is a flowchart of an example process 1000 associated with forming a pixel sensor described herein. In some implementations, one or more process blocks of FIG. 10 are performed by one or more semiconductor processing tools (e.g., one or more of the semiconductor processing tools 102-116). Additionally, or alternatively, one or more process blocks of FIG. 10 may be performed by one or more components of device 800, such as processor 820, memory 830, input component 840, output component 850, and/or communication component 860.

As shown in FIG. 10, process 1000 may include forming, in a substrate, a photodiode for a pixel sensor of a pixel array (block 1010). For example, one or more of the semiconductor processing tools 102-116 may form, in a substrate 302, a photodiode 304 for a pixel sensor 202 of a pixel array 200, as described herein.

As further shown in FIG. 10, process 1000 may include forming, in the substrate, a drain region for the pixel sensor (block 1020). For example, one or more of the semiconductor processing tools 102-116 may form, in the substrate 302, a drain region 312 for the pixel sensor 202, as described herein.

As further shown in FIG. 10, process 1000 may include forming, in the substrate, a trench adjacent to the photodiode and the drain region (block 1030). For example, one or more of the semiconductor processing tools 102-116 may form, in the substrate 302, a trench (e.g., a recess 602) adjacent to the photodiode 304 and the drain region 312, as described herein.

As further shown in FIG. 10, process 1000 may include performing a pre-cleaning operation to remove a residual oxide layer from the trench (block 1040). For example, one or more of the semiconductor processing tools 102-116 may perform a pre-cleaning operation to remove a residual oxide layer (e.g., an oxide layer 604) from the trench, as described herein. In some implementations, the pre-cleaning operation includes using a plurality of deposition and etch cycles to react oxygen in the residual oxide layer using germanium.

As further shown in FIG. 10, process 1000 may include forming, after performing the pre-cleaning operation, a boron layer on sidewalls of the trench and on a bottom surface of the trench (block 1050). For example, one or more of the semiconductor processing tools 102-116 may form, after performing the pre-cleaning operation, a boron layer (e.g., a passivation layer 320a) on sidewalls of the trench and on a bottom surface of the trench, as described herein.

As further shown in FIG. 10, process 1000 may include filling the trench with a dielectric material over the boron layer to form a DTI structure (block 1060). For example, one or more of the semiconductor processing tools 102-116 may fill the trench with a dielectric material over the boron layer to form a DTI structure 204, as described herein. In some implementations, the dielectric material includes an oxide material Process 1000 may include additional implementations, such as any single implementation or any combination of implementations described below and/or in connection with one or more other processes described elsewhere herein.

In a first implementation, performing a deposition and etch cycle, of the plurality of deposition and etch cycles, includes performing a deposition operation to deposit a germanium layer 606 on the residual oxide layer, where germanium of the germanium layer 606 reacts with oxygen in the residual oxide layer to form a germanium oxide ($GeO_x$) during a stabilization duration, and where the germanium of the germanium layer 606 reacts with silicon in the residual oxide layer to form a monolayer (e.g., a byproduct layer 08), and performing an etch operation to remove the monolayer after the stabilization duration.

In a second implementation, alone or in combination with the first implementation, a thickness of the monolayer, that is removed by the deposition and etch cycle, is included in a range of approximately 0.8 nanometers to approximately 2 nanometers. In a third implementation, alone or in combination with one or more of the first and second implementations, performing the pre-cleaning operation includes performing the plurality of deposition and etch cycles in a single processing chamber without breaking a vacuum in the single processing chamber.

In a fourth implementation, alone or in combination with one or more of the first through third implementations, performing the pre-cleaning operation includes performing the pre-cleaning operation to remove surface carbon contamination from the recess 602. In a fifth implementation, alone or in combination with one or more of the first through fourth implementations, a quantity of the plurality of deposition and etch cycles is included in a range of approximately 10 cycles to approximately 30 cycles. In a sixth implementation, alone or in combination with one or more of the first through fifth implementations, performing the pre-cleaning operation includes performing the pre-cleaning operation at a pressure that is included in a range of approximately 10 torr to approximately 40 torr.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

In this way, a cyclic pre-cleaning technique may be used to clean the surfaces of a recess in which a DTI structure is to be formed. The cyclic pre-cleaning technique may include performing one or more deposition and etch cycles to remove oxygen from the surfaces of the recess to reduce the oxygen concentration in the surfaces of the recess. A passivation layer may be formed in the recess after the cyclic pre-cleaning technique is used to clean the surfaces. The cyclic pre-cleaning technique may include the use of germanium (Ge) to bond with oxygen in the surfaces of the recess, which results in the formation of germanium oxide (GeO). The germanium oxide is removed, resulting in reduced oxygen concentration in the surfaces of the recess. The reduced oxygen concentration increases the quality of epitaxial growth of the passivation layer in the recess.

As described in greater detail above, some implementations described herein provide a method. The method includes forming a trench in a substrate of a semiconductor device. The substrate includes a residual oxide layer over an inner sidewall of the trench. The method includes providing a germanium precursor to react with the residual oxide layer and to form a germanium-containing layer over the inner sidewall of the trench. The method includes etching at least a portion of the germanium-containing layer.

As described in greater detail above, some implementations described herein provide a method. The method includes forming, in a substrate, a photodiode for a pixel sensor of a pixel array. The method includes forming, in the substrate, a drain region for the pixel sensor. The method includes forming, in the substrate, a trench adjacent to the photodiode and the drain region. The method includes performing a pre-cleaning operation to remove a residual oxide layer from the trench, where the pre-cleaning operation includes using a plurality of deposition and etch cycles to react oxygen in the residual oxide layer using germanium. The method includes forming, after performing the pre-cleaning operation, a boron layer on sidewalls of the trench and on a bottom surface of the trench. The method includes filling the trench with a dielectric material over the boron layer to form a DTI structure.

As described in greater detail above, some implementations described herein provide a pixel sensor. The pixel sensor includes a silicon substrate. The pixel sensor includes a photodiode in the silicon substrate. The pixel sensor includes a drain region in the silicon substrate. The pixel sensor includes a DTI structure in the silicon substrate, where the DTI structure surrounds the photodiode and the drain region, and where the DTI structure includes a boron layer and an oxide structure over the boron layer. The pixel sensor includes a silicon germanium (SiGe) layer at an interface between the boron layer and the silicon substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming, in a substrate, a photodiode for a pixel sensor of a pixel array;
   forming, in the substrate, a drain region for the pixel sensor;
   forming, in the substrate, a trench adjacent to the photodiode and the drain region;
   performing a deposition operation to deposit a germanium layer on the trench,
     wherein germanium of the germanium layer reacts with oxygen in the trench to form a germanium oxide ($GeO_x$) during a stabilization duration, and
     wherein the germanium of the germanium layer reacts with silicon in the trench to form a monolayer;
   performing an etch operation to remove the monolayer after the stabilization duration;
   forming, after performing the etch operation, a boron layer on sidewalls of the trench and on a bottom surface of the trench; and
   filling the trench with a dielectric material over the boron layer to form a deep trench isolation (DTI) structure.

2. The method of claim 1, wherein the dielectric material includes an oxide material.

3. The method of claim 1, further comprising:
   performing a pre-cleaning operation to remove a residual oxide layer from the trench.

4. The method of claim 3, wherein performing the pre-cleaning operation comprises:
   performing a plurality of deposition and etch cycles in a single processing chamber without breaking a vacuum in the single processing chamber.

5. The method of claim 4, wherein a thickness of the monolayer, that is removed by a deposition and etch cycle of the plurality of deposition and etch cycles, is included in a range of approximately 0.8 nanometers to approximately 2 nanometers.

6. The method of claim 4, wherein a quantity of the plurality of deposition and etch cycles is included in a range of approximately 10 cycles to approximately 30 cycles.

7. The method of claim 3, wherein performing the pre-cleaning operation comprises:
   performing the pre-cleaning operation to remove surface carbon contamination from the trench.

8. The method of claim 3, wherein performing the pre-cleaning operation comprises:
   performing the pre-cleaning operation at a pressure that is included in a range of approximately 10 torr to approximately 40 torr.

9. A method, comprising:
   forming, in a substrate, a photodiode for a pixel sensor of a pixel array;
   forming, in the substrate, a drain region for the pixel sensor;
   forming, in the substrate, a trench adjacent to the photodiode and the drain region;
   performing a deposition operation to deposit a germanium layer in the trench,
     wherein germanium of the germanium layer reacts with oxygen in the trench to form a germanium oxide ($GeO_x$) during a stabilization duration, and
     wherein the germanium of the germanium layer reacts with silicon in the trench to form a monolayer;
   performing an etch operation to remove the monolayer after the stabilization duration;
   forming, after performing the etch operation, a boron layer on sidewalls of the trench and on a bottom surface of the trench; and
   filling the trench with a dielectric material over the boron layer to form a deep trench isolation (DTI) structure.

10. The method of claim 9, wherein the trench is formed in the substrate and a deep p-well region of the substrate.

11. The method of claim 9, wherein, to deposit the germanium layer, the deposition operation is to provide a germanium precursor including a germanium hydride ($GeH_x$).

12. The method of claim 11, wherein the germanium precursor is provided at a temperature that is included in a range of approximately 380 degrees Celsius to approximately 410 degrees Celsius.

13. The method of claim 9, wherein the etch operation is performed using hydrochloric acid (HCl).

14. A method, comprising:
   forming a trench in a substrate of a semiconductor device;
   forming a germanium layer in the trench,
     wherein germanium of the germanium layer reacts with oxygen in the trench to form a germanium oxide ($GeO_x$) during a stabilization duration, and
     wherein the germanium of the germanium layer reacts with silicon in the trench to form a monolayer;
   performing an etch operation to remove the monolayer after the stabilization duration; and forming, after performing the etch operation, a deep trench isolation (DTI) structure in the trench.

15. The method of claim 14, wherein forming the germanium layer in the trench comprises:
providing a germanium precursor, comprising a germanium hydride ($GeH_x$), in the trench.

16. The method of claim 15, wherein the germanium precursor is provided at a temperature in a range of approximately 380 degrees Celsius to approximately 410 degrees Celsius.

17. The method of claim 14, wherein forming the DTI structure comprises:
etching at least a portion of the germanium layer in the trench.

18. The method of claim 17, wherein etching the at least the portion of the germanium layer in the trench comprises:
etching at least the portion of the germanium layer at a temperature that is included in a range of approximately 380 degrees Celsius to approximately 410 degrees Celsius.

19. The method of claim 14, wherein the DTI structure includes a dielectric material.

20. The method of claim 19, wherein the dielectric material includes an oxide material.

* * * * *